(12) United States Patent
Zhu et al.

(10) Patent No.: US 12,395,623 B2
(45) Date of Patent: *Aug. 19, 2025

(54) INTRA CODED VIDEO USING QUANTIZED RESIDUAL DIFFERENTIAL PULSE CODE MODULATION CODING

(71) Applicant: Bytedance Inc., Los Angeles, CA (US)

(72) Inventors: Weijia Zhu, San Diego, CA (US); Li Zhang, San Diego, CA (US); Jizheng Xu, San Diego, CA (US); Hsiao Chiang Chuang, San Diego, CA (US)

(73) Assignee: Bytedance Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/876,000

(22) Filed: Jul. 28, 2022

(65) Prior Publication Data

US 2022/0377321 A1 Nov. 24, 2022

Related U.S. Application Data

(63) Continuation of application No. 17/502,233, filed on Oct. 15, 2021, now Pat. No. 11,431,966, which is a
(Continued)

(30) Foreign Application Priority Data

May 1, 2019 (WO) ................ PCT/CN2019/085398

(51) Int. Cl.
*H04N 19/159* (2014.01)
*H04N 19/105* (2014.01)
(Continued)

(52) U.S. Cl.
CPC ......... *H04N 19/105* (2014.11); *H04N 19/159* (2014.11); *H04N 19/176* (2014.11); *H04N 19/70* (2014.11)

(58) Field of Classification Search
CPC .......................... H04N 19/105; H04N 19/159
See application file for complete search history.

(56) References Cited

U.S. PATENT DOCUMENTS 6,393,059 B1 5/2002 Sugiyama
8,208,545 B2 6/2012 Seo
(Continued)

FOREIGN PATENT DOCUMENTS

BR 112021020796-1 A2 4/2020
BR 112021020796-1 B1 4/2020
(Continued)

OTHER PUBLICATIONS phenix.it-sudparis.eu/jvet/doc_end_user/current_document.php?id=5755, Oct. 20, 2022.
(Continued)

*Primary Examiner* — Irfan Habib
(74) *Attorney, Agent, or Firm* — Conley Rose, P.C.

(57) ABSTRACT

Video coding and decoding methods are described. In example method includes performing a conversion between a current video block of a video and a bitstream representation of the current video block by determining a first intra coding mode to be stored which is associated with the current video block using a differential coding mode, where the first intra coding mode associated with the current video block is determined according to a second prediction mode used by the differential coding mode, and where, in the differential coding mode, a difference between a quantized residual of an intra prediction of the current video block and a prediction of the quantized residual is represented in the bitstream representation for the current video block using a differential pulse coding modulation (DPCM) representation.

17 Claims, 20 Drawing Sheets

Related U.S. Application Data continuation of application No. PCT/US2020/030684, filed on Apr. 30, 2020.

(51) Int. Cl.
*H04N 19/176* (2014.01)
*H04N 19/70* (2014.01)

(56) References Cited

U.S. PATENT DOCUMENTS

| | | | |
|---|---|---|---|
| 9,641,844 | B2 | 5/2017 | Kim |
| 9,648,335 | B2 | 5/2017 | Rapaka et al. |
| 9,667,990 | B2 | 5/2017 | Chen et al. |
| 9,716,894 | B2 | 7/2017 | Joshi |
| 9,749,661 | B2 | 8/2017 | Wang et al. |
| 9,838,684 | B2 | 12/2017 | Coban et al. |
| 9,979,975 | B2 | 5/2018 | Rapaka et al. |
| 10,057,574 | B2 | 8/2018 | Li et al. |
| 10,142,654 | B2 | 11/2018 | Peng |
| 10,382,754 | B2 | 8/2019 | Li et al. |
| 10,390,050 | B2 | 8/2019 | An et al. |
| 10,404,988 | B2 | 9/2019 | Ye et al. |
| 10,750,172 | B2 | 8/2020 | Vanam et al. |
| 10,812,817 | B2* | 10/2020 | Li .................... H04N 19/174 |
| 10,939,096 | B2* | 3/2021 | Xiu .................... H04N 19/147 |
| 11,070,812 | B2* | 7/2021 | Coban .................... H04N 19/70 |
| 11,146,785 | B2* | 10/2021 | Zhang .................... H04N 19/52 |
| 11,159,816 | B2* | 10/2021 | Liu .................... H04N 19/523 |
| 11,159,817 | B2* | 10/2021 | Zhang .................... H04N 19/513 |
| 11,190,790 | B2 | 11/2021 | Jang |
| 11,197,003 | B2* | 12/2021 | Zhang .................... H04N 19/109 |
| 11,431,966 | B2 | 8/2022 | Zhu et al. |
| 11,431,984 | B2 | 8/2022 | Zhu |
| 11,438,597 | B2 | 9/2022 | Zhu |
| 11,438,602 | B2 | 9/2022 | Zhu et al. |
| 12,075,094 | B2 | 8/2024 | Zhu et al. |
| 2007/0065026 | A1 | 3/2007 | Lee et al. |
| 2009/0161759 | A1 | 6/2009 | Seo et al. |
| 2010/0172582 | A1 | 7/2010 | Ding |
| 2012/0039388 | A1 | 2/2012 | Kim et al. |
| 2012/0128260 | A1 | 5/2012 | Jung |
| 2012/0224640 | A1 | 9/2012 | Sole Rojals et al. |
| 2013/0114716 | A1 | 5/2013 | Gao et al. |
| 2013/0114730 | A1 | 5/2013 | Joshi et al. |
| 2013/0182758 | A1 | 7/2013 | Seregin |
| 2013/0272379 | A1 | 10/2013 | Sole Rojals et al. |
| 2013/0343464 | A1 | 12/2013 | Van Der Auwera et al. |
| 2014/0016698 | A1 | 1/2014 | Joshi et al. |
| 2014/0098856 | A1 | 4/2014 | Gu et al. |
| 2014/0226721 | A1 | 8/2014 | Joshi et al. |
| 2014/0286400 | A1 | 9/2014 | Joshi et al. |
| 2014/0286413 | A1 | 9/2014 | Joshi et al. |
| 2014/0362917 | A1* | 12/2014 | Joshi .................... H04N 19/129 |
| | | | 375/240.12 |
| 2015/0016501 | A1 | 1/2015 | Guo et al. |
| 2015/0063454 | A1 | 3/2015 | Guo |
| 2015/0189272 | A1 | 7/2015 | Peng et al. |
| 2015/0189321 | A1 | 7/2015 | Chen et al. |
| 2015/0195545 | A1 | 7/2015 | Wang et al. |
| 2015/0264376 | A1 | 9/2015 | Zou |
| 2016/0029035 | A1 | 1/2016 | Nguyen et al. |
| 2016/0100117 | A1 | 4/2016 | Kato et al. |
| 2016/0100175 | A1 | 4/2016 | Laroche et al. |
| 2016/0100189 | A1 | 4/2016 | Pang |
| 2017/0272782 | A1 | 9/2017 | Li et al. |
| 2017/0366807 | A1 | 12/2017 | Thoreau |
| 2017/0366818 | A1 | 12/2017 | Zhang et al. |
| 2018/0014017 | A1 | 1/2018 | Li et al. |
| 2018/0063531 | A1 | 3/2018 | Hu et al. |
| 2018/0205946 | A1 | 7/2018 | Zhang |
| 2018/0205947 | A1 | 7/2018 | Xu et al. |
| 2018/0213227 | A1 | 7/2018 | Lim |
| 2018/0278958 | A1 | 9/2018 | Hsiang |
| 2018/0288415 | A1 | 10/2018 | Li et al. |
| 2018/0295382 | A1 | 10/2018 | Liu et al. |
| 2018/0324420 | A1 | 11/2018 | Wang et al. |
| 2018/0352226 | A1 | 12/2018 | An et al. |
| 2019/0045184 | A1 | 2/2019 | Zhang et al. |
| 2019/0306516 | A1 | 10/2019 | Misra |
| 2019/0364275 | A1 | 11/2019 | Li et al. |
| 2020/0236353 | A1 | 7/2020 | Zhang et al. |
| 2020/0260070 | A1 | 8/2020 | Yoo et al. |
| 2020/0275111 | A1* | 8/2020 | Zhao .................... H04N 19/13 |
| 2020/0275121 | A1* | 8/2020 | Zhao .................... H04N 19/176 |
| 2020/0280742 | A1 | 9/2020 | Ramasubramonian et al. |
| 2020/0296381 | A1 | 9/2020 | Coban et al. |
| 2020/0296390 | A1* | 9/2020 | Chao .................... H04N 19/50 |
| 2020/0296420 | A1 | 9/2020 | Karczewics et al. |
| 2020/0329257 | A1 | 10/2020 | Zhao et al. |
| 2021/0029351 | A1* | 1/2021 | Zhang .................... H04N 19/105 |
| 2021/0029352 | A1 | 1/2021 | Zhang et al. |
| 2021/0112262 | A1 | 4/2021 | Jang |
| 2021/0112284 | A1 | 4/2021 | Zhang et al. |
| 2021/0136405 | A1 | 5/2021 | Chen |
| 2021/0274175 | A1 | 9/2021 | Lim et al. |
| 2021/0297662 | A1 | 9/2021 | Ko |
| 2021/0306654 | A1 | 9/2021 | Lee |
| 2021/0321136 | A1 | 10/2021 | Jung et al. |
| 2021/0385439 | A1 | 12/2021 | Zhu et al. |
| 2021/0385442 | A1 | 12/2021 | Zhu et al. |
| 2021/0385459 | A1 | 12/2021 | Zhu et al. |
| 2021/0400279 | A1 | 12/2021 | Ko |
| 2022/0030280 | A1 | 1/2022 | Zhu et al. |
| 2022/0038687 | A1 | 2/2022 | Zhu et al. |
| 2022/0038717 | A1 | 2/2022 | Zhu et al. |
| 2022/0060710 | A1 | 2/2022 | Liu et al. |

FOREIGN PATENT DOCUMENTS

| | | |
|---|---|---|
| BR | 112021020796 A2 | 12/2021 |
| CN | 104041048 A | 9/2014 |
| CN | 104380734 A | 2/2015 |
| CN | 105075270 A | 11/2015 |
| CN | 105264891 A | 1/2016 |
| CN | 105556963 A | 5/2016 |
| CN | 106105227 A | 11/2016 |
| CN | 106464890 A | 2/2017 |
| CN | 107211121 A | 9/2017 |
| CN | 108028919 A | 5/2018 |
| CN | 108353167 A | 7/2018 |
| CN | 108366260 A | 8/2018 |
| CN | 108632611 A | 10/2018 |
| CN | 108712651 A | 10/2018 |
| CN | 109417639 A | 3/2019 |
| CN | 109479129 A | 3/2019 |
| CN | 109644281 A | 4/2019 |
| CN | 109792538 A | 5/2019 |
| CN | 113711611 B | 3/2024 |
| CN | 113728642 B | 4/2024 |
| CN | 113785306 B | 6/2024 |
| EP | 3939251 A4 | 5/2022 |
| ID | P000095872 B | 10/2024 |
| IN | 201627029614 A | 7/2016 |
| JP | 2016524409 A | 8/2016 |
| JP | 2018056685 A | 4/2018 |
| JP | 2022514921 A | 2/2022 |
| JP | 7288084 B2 | 6/2023 |
| JP | 7311627 B2 | 7/2023 |
| KR | 20150055858 A | 5/2015 |
| KR | 20160016861 A | 2/2016 |
| KR | 20160093061 A | 8/2016 |
| KR | 20190028525 A | 3/2019 |
| KR | 102685240 B1 | 7/2024 |
| KR | 102696039 B1 | 8/2024 |
| KR | 102707777 B1 | 9/2024 |
| NO | 2018064948 A1 | 4/2018 |
| RU | 2580066 C2 | 4/2016 |
| RU | 2014145851 A | 6/2016 |
| RU | 2641252 C2 | 1/2018 |
| WO | 2011018965 A1 | 2/2011 |
| WO | 2013070707 A1 | 5/2013 |
| WO | 2013192537 A2 | 12/2013 |
| WO | 2017184970 A1 | 10/2017 |
| WO | 2017206803 A1 | 12/2017 |

(56) References Cited

FOREIGN PATENT DOCUMENTS

| WO | 2019026807 A1 | 2/2019 |
|---|---|---|
| WO | 2019029951 A1 | 2/2019 |
| WO | 2020180102 A1 | 9/2020 |
| WO | 2020213931 A1 | 10/2020 |
| WO | 2020214980 A1 | 10/2020 |
| WO | 2020219512 A1 | 10/2020 |
| WO | 2020223449 A1 | 11/2020 |
| WO | 2020256389 A1 | 12/2020 |

OTHER PUBLICATIONS vcgit.hhi.fraunhofer.de/jvet/VVCSoftware_VTM/tags/VTM-4.0, Oct. 20, 2022.

Bross et al., "Non-CE8: Unified Transform Type Signalling and Residual Coding for Transform Skip Mode," Joint Video Experts Team {JVET) of ITU-T SG 16 WP 3 and ISO/IEC JTC 1/SC 29/WG 11, 13th Meeting, Marrakech, MA, Jan. 9-18, 2019, document JVET-M0464, 2019.

Bross et al. "CEB: Residual Coding for Transform Skip Mode {CE8-4.3a, CE8-4.3b, CE8-4.4a, and CE8-4.4b)," Joint Video Experts Team {JVET) of ITU-T SG 16 WP 3 and ISO/IEC JTC 1/SC 29/WG 11, 14th Meeting, Geneva, CH, Mar. 19-27, 2019, document JVET-N0280, 2019.

Said et al. "CE5: Per-Context CABAG Initialization with Single Window (Test 5.1.4)," Joint Video Experts Team (JVET of ITU-T SG 16 WP 3 and ISO/IEC JTC 1/SC 29/WG 11, 13th Meeting, Marrakech, MA, Jan. 9-18, 2019, document JVET-M0413, 2019.

Information Technology—High Efficiency Coding and Media Delivery in Heterogeneous Environments—Part 2: High Efficiency Video Coding Apr. 20, 2018, ISO/DIS 23008, 4th Edition.

Bross et al. "Versatile Video Coding (Draft 4)," Joint Video Experts Team {JVET) of ITU-T SG 16 WP 3 and ISO/IEC JTC 1/SC 29/WG 11, 13th Meeting, Marrakech, MA, Jan. 9-18, 2019, document JVET-M1001, 2019.

Lee et al., "Improved Lossless Intra Coding for H.264/MPEG-4 AVG," IEEE Transactions on Image Processing, Sep. 2006, 15(9):2610-2615., retrieved on Jun. 15, 2020 from http://dms.sejong.ac.kr/thesis/broad_thesis/01673442.pdf>entire document.

Kim et al. "Improved Residual DPCM for HEVC Lossless Coding," 2014 27th SIBGRAPI Conference on Graphics, Patterns and Images, 2014, pp. 95-102.

Karczewicz et al. "CE8-Related: Quantized Residual BDPCM," Joint Video Experts Team (JVET) of ITU-T SG 16 WP 3 and ISO/IEC JTC 1/SC 29/WG 11, 14th Meeting, Geneva, CH, Mar. 19-27, 2019, document JVET-N0413, 2019.

Bross et al. "Versatile Video Coding {Draft 5)," Joint Video Experts Team {JVET) of ITU-T SG 16 WP 3 and ISO/IEC JTC 1/SC 29/WG 11, 14th Meeting, Geneva, CH. Mar. 19-27, 2019, document JVET-N1001, 2019.

"High Efficiency Video Coding," Series H: Audiovisual and Multimedia Systems: Infrastructure of Audiovisual Services—Coding of Moving Video, ITU-T Telecommunication Standardization Sector of ITU, H.265, Feb. 2018.

Mrak et al. "Improving Screen Content Coding in HEVC by Transform Skipping," 20th European Signal Processing Conference (EUSIPCO 2012), Bucharest, Romania, Aug. 27-31, 2012, retrieved on Jun. 11, 2020 from <https://www.eurasip.org/Proceedings/Eusipco/Eusipco2012/Conference/papers/1569583173.pdf>.

Sole et al., "Transform Coefficient Coding in HEVC," IEEE Transactions on Circuits and Systems for Video Technology, Dec. 2012, 22(12):1765-1777. Retrieved on Jun. 11, 2020 from <<https://ieeexplore.ieee.org/stamp/stamp.jsp?arnumber=6324418>.

Kang et al. "Efficient Residual DPCM Using L1 Robust Linear Predicton in Screen Content Video Coding," IEEE Transactions on Multimedia, Oct. 2016, 18(10):2054-2065.

Schwarz et al. "Non-CE7: Alternative Entropy Coding for Dependent Quantization," Joint Video Experts Team JVET) of ITU-T SG 16 WP 3 and ISO/IEC JTC 1/SC 29/WG 11 11th Meeting, Ljubljana, SI, Jul. 10-18, 2018, document JVET-K0072, 2018.

Tsukuba et al. "Non-CE6: On Transfrom Skip for Larger Block," Joint Vidoe Experts Team (JVET) of ITU-T SG 16 1/1/P 3 and ISO/IEC JTC 1/SC 29/WG 11, 13th Meeting, Marrakech, MA, Jan. 9-18, 2019, document JVET-M0072, 2019.

Ku et al. "Description of Core Experiment 8: Screen Content Coding Tools," Joint Video Experts Team (JVET) of ITU-, SG 16 WP 3 and ISO/IEC JTC 1/SC 29/WG 11 12th Meeting, Macao, CN, Oct. 3-12, 2018, document JVET-L1028, 2018.

Kang et al. "Non-RCE3: Explicit Signaling of Intra RDPCM," Joint Collaborative Team on Video Coding (JCT-VC) of TU-T SG 16 WP 3 and ISO/IEC JTC 1/SC 29/WG 11 15th Meeting, Geneva, CH, Oct. 23- Nov. 1, 2013, document JCTVC-00178, 2013.

Tan et al. "Non-RCE3: Unified Lossless Residual Coding," Joint Collaborative Team on Video Coding {JCT-VC) of TU-T SG 16 WP 3 and ISO/IEC JTC 1/SC 29/WG 11, 15th Meeting, Geneva, C, Oct. 23 to Nov. 1, 2013, document JCTVC-O0087, 2013.

Abdoli et al. "CE8: BDPCM with Horizontal/Vertical Predictor and Independently Decodable Areas (Test 8.3.1b)," Joint Video Experts Team (JVET) of ITU-T SG 16 WP 3 and ISO/IEC JTC 1/SC 29/WG 11 13th Meeting, Marrakech, MA, Jan. 9-18, 2019, document JVET-M0057, 2019.

Zhu et al. "Non-CE8: Adaptive Single/Dual Tree with IBC Simplification," Joint Video Experts Team {JVET) of ITU-T SG 16 WP 3 and ISO/IEC JTC 1/SC 29/WG 11 15th Meeting, Gothenburg, SE, Jul. 3-12, 2019, document JVET-O0258, 2019.

Sharman et al. "AHG5: Unifying DPCM," Joint Collaborative Team on Video Coding {JCT-VC) of ITU-T SG 16 WP 3 and ISO/IEC JTC 1/SC 29/WG 11, 15th Meeting, Geneva, CH Oct. 23-Nov. 1, 2013, document JCTVC-O0066, 2013.

Coban et al. "Unified Syntax for JVET-O0165/O0200/O0783 on TS and BDPCM Signalling," Joint Video Experts Team (JVET) of ITU-T SG 16 WP 3 and ISO/IEC JTC 1/SC 29/WG 11 15th Meeting: Gothenburg, SE, Jul. 3-12, 2019, document JVET-O1136, 2019.

Document: JVET-N0455, Karczewicz, M., et al., "CE8-related: Sign context modelling and level mapping for TS residual coding," Joint Video Experts Team (JVET) of ITU-T SG 16 WP 3 and ISO/IEC JTC 1/SC 29/WG 11, 14th Meeting: Geneva, CH, Mar. 19-27, 2019, 7 pages.

Document: JVET-N0843-v1, Xu, X., et al., "CE8-related: Combination test of JVET-N0176/JVET-N0317/JVET-N0382 on simplification of IBC vector prediction," Joint Video Experts Team (JVET) of ITU-T SG 16 WP 3 and ISO/IEC JTC 1/SC 29/WG 11, 14th Meeting: Geneva, CH, Mar. 19-27, 2019, 13 pages.

Final Office Action from U.S. Appl. No. 17/399,904 dated Apr. 15, 2022.

Non Final Office Action from U.S. Appl. No. 17/399,904 dated Dec. 29, 2021.

Notice of Allowance from U.S. Appl. No. 17/411,296 dated Jun. 10, 2022.

Final Office Action from U.S. Appl. No. 17/411,296 dated Feb. 22, 2022.

Non Final Office Action from U.S. Appl. No. 17/411,296 dated Nov. 8, 2021.

Non Final Office Action from U.S. Appl. No. 17/411,333 dated Nov. 26, 2021.

Non Final Office Action from U.S. Appl. No. 17/494,934 dated Jan. 19, 2022.

Non Final Office Action from U.S. Appl. No. 17/502,202 dated Feb. 11, 2022.

Office Action from Indian Patent Application No. 202127047361 dated May 4, 2022 (7 pages).

Extended European Search Report from European Patent Application No. 20791070.4 dated Apr. 4, 2022 (11 pages).

Extended European Search Report from European Patent Application No. 20794015.6 dated May 2, 2022 (12 pages).

Extended European Search Report from European Patent Application No. 20794622.9 dated May 13, 2022 (11 pages).

Extended European Search Report from European Patent Application No. 20798575.5 dated May 10, 2022 (12 pages).

Extended European Search Report from European Patent Application No. 20798668.8 dated May 9, 2022 (9 pages).

(56) References Cited

OTHER PUBLICATIONS

International Search Report and Written Opinion from International Patent Application No. PCT/US2020/028807 dated Aug. 4, 2020 (13 pages).
International Search Report and Written Opinion from International Patent Application No. PCT/US2020/028808 dated Jul. 2, 2020 (10 pages).
International Search Report and Written Opinion from International Patent Application No. PCT/US2020/029598 dated Jul. 6, 2020 (11 pages).
International Search Report and Written Opinion from International Patent Application No. PCT/US2020/029603 dated Jul. 9, 2020 (8 pages).
International Search Report and Written Opinion from International Patent Application No. PCT/US2020/030684 dated Jul. 21, 2020 (8 pages).
International Search Report and Written Opinion from International Patent Application No. PCT/US2020/030979 dated Aug. 4, 2020 (12 pages).
International Search Report and Written Opinion from International Patent Application No. PCT/US2020/030984 dated Aug. 4, 2020 (9 pages).
International Search Report and Written Opinion from International Patent Application No. PCT/US2020/034839 dated Sep. 22, 2020 (10 pages).
Office Action dated Feb. 10, 2022, 17 pages, U.S. Appl. No. 17/502,233, filed Feb. 10, 2022.
Notice of Allowance dated Jun. 8, 2022, 27 pages, U.S. Appl. No. 17/502,233, filed Feb. 10, 2022.
Office Action dated Aug. 2, 2022, 13 pages, U.S. Appl. No. 17/494,934, filed Oct. 6, 2021.
Foreign Communication From A Related Counterpart Application, Japanese Application No. 2021-562399, Japanese Office Action dated Nov. 29, 2022, 4 pages.
Foreign Communication From A Related Counterpart Application, Japanese Application No. 2021-563191, Japanese Office Action dated Dec. 20, 2022, 4 pages.
Notice of Allowance dated Jan. 25, 2023, 16 pages, U.S. Appl. No. 17/494,934, filed Oct. 6, 2021.
Document: JVET-N1001-v3, Bross, B., et al., "Versatile Video Coding (Draft 5)" Joint Video Experts Team (JVET) of ITU-T SG 16 WP 3 and ISO/IEC JTC 1/SC 29/WG 11, 14th Meeting: Geneva, CH, Mar. 19-27, 2019, 371 pages.
Document: JVET-N1001-v2, Bross, B., et al., "Versatile Video Coding (Draft 5)" Joint Video Experts Team (JVET) of ITU-T SG 16 WP 3 and ISO/IEC JTC 1/SC 29/WG 11 14th Meeting: Geneva, CH, Mar. 19-27, 2019, 361 pages.
Document: JVET-M0464-v4, Bross, B., et al., "Non-CE8: Unified Transform Type Signalling and Residual Coding for Transform Skip Mode," Joint Video Experts Team (JVET) of ITU-T SG 16 WP 3 and ISO/IEC JTC 1/SC 29/WG 11, 13th Meeting, Marrakech, MA, Jan. 9-18, 2019, 13 pages.
Non-Final Office Action dated Mar. 24, 2023, 48 pages, U.S. Patent Application No. 17/881, 197 filed Aug. 4, 2022.
Document: JVET-N0413-v5, Karczewicz, M., et al., "CE8-related: Quantized residual BDPCM," Joint Video Experts Team (JVET) of ITU-T SS 16 WP 3 and ISO/IEC JTC 1/SC 29/WG 11 14th Meeting: Geneva, CH, Mar. 19-27, 2019, 6 pages.
Document: JVET-N0214, Clare, G., et al., "CE8: Bdpcm with harmonized residual coding and CCB limitation (CE8-3.1a, CE8-3.1b, CE8-5.1a, CE8-5.1b)," Joint Video Experts Team (JVET) of ITU-T SG 16 WP 3 and ISO/IEC JTC 1/SC 29/WG 11 14th Meeting: Geneva, CH, Mar. 19-27, 2019, 14 pages.
Document: JVET-J0029-v1, Li, X., et al., "Description of SDR video coding technology proposal by Tencent," Joint Video Experts Team (JVET) of ITU-T SG 16 WP 3 and ISO/IEC JTC 1/SC 29/WG 11 10th Meeting: San Diego, US, Apr. 10-20, 2018, 34 pages.
Document: JVET-O0078, Zhang, L., et al., "CE8-1.7: Single HMVP table for all CUs inside the shared merge list region for IBC," Joint Video Experts Team (JVET) of ITU-T SG 16 WP 3 and ISO/IEC JTC 1/SC 29/WG 11 15th Meeting: Gothenburg, SE, Jul. 3-12, 2019, 3 pages.
Document: JVET-N1001-v8, Bross, B., et al., "Versatile Video Coding (Draft 5)," Joint Video Experts Team (JVET) of ITU-T SG 16 WP 3 and ISO/IEC JTC 1/SC 29/WG 11 14th Meeting: Geneva, CH, Mar. 19-27, 2019, 397 pages.
Non-Final Office Action from U.S. Appl. No. 17/866,036 dated Jun. 5, 2024, 58 pages.
European Office Action from European Application No. 20799044.1 dated May 27, 2024, 5 pages.
JVET-N0390-r1, Francois, E., et al., "AHG16/non-CE3: Study of CCLM restrictions in case of separate luma/chroma tree," Joint Video Experts Team (JVET) of ITU-T SG 16 WP 3 and ISO/IEC JTC 1/SC 29/WG 11, 14th Meeting: Geneva, CH, Mar. 19-27, 2019, 9 pages.
JVET-N0123-v2, Tsukuba, T., et al., "AHG13/Non-CE6/CE8: Chroma Transform Skip," Joint Video Experts Team (JVET) of ITU-T SG 16 WP 3 and ISO/IEC JTC 1/SC 29/WG 11, 14th Meeting: Geneva, CH, Mar. 19-27, 2019, 8 pages.
JVET-N0357-v2 Broiss, B., et al., "CE8-related: Context Modelling of Sign for TS Residual Coding," Joint Video Experts Team (JVET) of ITU-T SG 16 WP 3 and ISO/IEC JTC 1/SC 29/WG 11, 14th Meeting: Geneva, CH, Mar. 19-27, 2019, 4 pages.
Advisory Action for U.S. Appl. No. 17/494,934, mailed Aug. 2, 2022, 13 Pages.
Document: JVET-N1001-v10, Bross B., et al., "Versatile Video Coding (Draft 5)", Joint Video Experts Team (JVET) of ITU-T SG 16 WP 3 and ISO/IEC JTC 1/SC 29/WG 11, 14 Meeting: Geneva, CH, Mar. 19-27, 2019, 407 Pages.
Document: JVET-N1001-v5, Bross B., et al., "Versatile Video Coding (Draft 5)," Joint Video Experts Team (JVET) of ITU-T SG 16 WP 3 and ISO/IEC JTC 1/SC 29/WG 11, 14th Meeting: Geneva, CH, Mar. 19-27, 2019, 374 Pages.
Communication Pursuant to Article 94(3) EPC for European Application No. 20798668.8, mailed Oct. 10, 2023, 5 Pages.
Document: JVET-O0078-V3, Wang, S., et al., "CE8-1.7: Single HMVP table for all CUs inside the shared merge list region for IBC," Joint Video Experts Team (JVET) of ITU-T SG 16 WP 3 and ISO/IEC JTC 1/SC 29/WG 11 15th Meeting: Gothenburg, SE, Jul. 3-12, 2019, 3 pages.
Extended European Search Report for European Application No. 20799044.1, mailed Apr. 22, 2022, 12 Pages.
Japanese Office Action from Japanese Patent Application No. 2023-086493 dated Jul. 30, 2024, 4 pages.
Japanese Office Action from Japanese Patent Application No. 2023-111065 dated Aug. 2024, 6 pages.
Non-Final Office Action for U.S. Appl. No. 17/881,197, mailed Mar. 24, 2023, 48 Pages.
Non-Final Office Action from U.S. Appl. No. 18/324,577 dated Mar. 26, 2024, 52 pages.
Notice of Acceptance for Patent Application for Australian Application No. 2020262284, mailed Sep. 12, 2023, 3 Pages.
Notice of Reasons for Refusal for Japanese Application No. 2023-086493, mailed Mar. 26, 2024, 12 Pages.
Office Action for Canadian Application No. 3, 137,099, mailed Oct. 26, 2023, 8 Pages.
Chinese Office Action from Chinese Patent Application No. 202080040213.0 dated Jan. 13, 2025, 20 pages.
Decision of Refusal for japanese patent application No. 2023-111065, Feb. 12, 2025, 5 pages.
Decision to Grant a Patent for Japanese Application No. 2023-0207743, mailed Jan. 21, 2025, 6 Pages.
Decision to Grant a Patent for Japanese patent application No. 2023-0086493, Jan. 21, 2025, 6 Pages.
Document: JVET-M1001-v6, Karczewicz, M., et al., "CE8-related: Quantized residual BDPCM," JVET-N0413_drafttext_v4.docxJVET-N0413 (version 5), Mar. 26, 2019, pp. 43-46, 49-50, 88, 96, 109, 111, 223-225 https://jvet-experts.org/doc_end_user/documents/14_Geneva/wg11/JVET-N0413-v5.zip.
Notice for Eligibility of Grant for Singapore patent application No. 11202111448W, mailed on Jan. 24, 2025, 4 pages.

(56) References Cited

OTHER PUBLICATIONS

Notice of Reasons for Refusal for Japanese patent application No. 2023-0206900, 12 Febrauary 2025, 10 Pages.
Notice of Allowance for Indonesian Application No. P00202108973, mailed Dec. 2, 2024, 4 pages.
Chinese Office Action from Chinese Patent Application No. 202080029880.9 dated Feb. 27, 2025, 15 pages.

* cited by examiner

INTRA CODED VIDEO USING QUANTIZED RESIDUAL DIFFERENTIAL PULSE CODE MODULATION CODING

CROSS REFERENCE TO RELATED APPLICATIONS

This application is a continuation of U.S. application Ser. No. 17/502,233 filed on Oct. 15, 2021, which is a continuation of International Patent Application No. PCT/US2020/030684 filed on Apr. 30, 2020, which claims the priority to and benefits of International Patent Application No. PCT/CN2019/085398 filed on May 1, 2019. All the aforementioned patent applications are hereby incorporated by reference in their entireties.

TECHNICAL FIELD

This patent document relates to video coding techniques, devices and systems.

BACKGROUND

In spite of the advances in video compression, digital video still accounts for the largest bandwidth use on the internet and other digital communication networks. As the number of connected user devices capable of receiving and displaying video increases, it is expected that the bandwidth demand for digital video usage will continue to grow.

SUMMARY

The present document describes various embodiments and techniques in which a secondary transform is used during decoding or encoding of video or images.

In one example aspect, a video processing method includes performing a conversion between a current video block of a video and a bitstream representation of the current video block by determining a first intra coding mode to be stored which is associated with the current video block using a differential coding mode, where the first intra coding mode associated with the current video block is determined according to a second prediction mode used by the differential coding mode, and where, in the differential coding mode, a difference between a quantized residual of an intra prediction of the current video block and a prediction of the quantized residual is represented in the bitstream representation for the current video block using a differential pulse coding modulation (DPCM) representation.

In another example aspect, a video processing method includes determining, according to a rule, an intra coding mode used by a differential coding mode during a conversion between a current video block of a video and a bitstream representation of the current video block; and performing, based on the determining, the conversion between the current video block and the bitstream representation of the current video block using the differential coding mode, where, in the differential coding mode, a difference between a quantized residual of an intra prediction of the current video block and a prediction of the quantized residual is represented in the bitstream representation for the current video block using a differential pulse coding modulation (DPCM) representation, and where the prediction of the quantized residual is performed according to the intra coding mode.

In another example aspect, a video processing method is disclosed. The method includes performing a conversion between a current video block and a bitstream representation of the current video block using a differential coding mode and selectively using an intra prediction mode based on a coexistence rule; wherein the intra prediction mode is used for generating predictions for samples of the current video block; and wherein, the differential coding mode is used to represent a quantized residual block from the predictions of the pixels, using a differential pulse coding modulation representation.

In another example aspect, another method of video processing is disclosed. The method includes performing a conversion between a current video block and a bitstream representation of the current video block using a differential coding mode in which a quantized residual block from a predictions of pixels of the current video block is represented using a differential pulse coding modulation representation; wherein a first direction of the prediction or a second direction of the differential coding mode is inferable from the bitstream representation.

In yet another example aspect, another method of video processing is disclosed. The method includes determining, based on an applicability rule, that a differential coding mode is applicable to a conversion between a current video block and a bitstream representation of the current video block; and performing the conversion between a current video block and a bitstream representation using the differential coding mode. Here, in the differential coding mode, a quantized residual block from intra prediction of pixels of the current video block is represented using a differential pulse coding modulation representation performed in a residual prediction direction that is different from a horizontal or a vertical direction.

In yet another example aspect, another method of video processing is disclosed. The method includes determining that a differential coding mode is applicable to a conversion between a current video block and a bitstream representation of the current video block; and performing the conversion between a current video block and a bitstream representation using an implementation rule of the differential coding mode; wherein, in the differential coding mode, a quantized residual block from intra prediction of pixels of the current video block is represented using a differential pulse coding modulation representation performed in a residual prediction direction that is different from a horizontal or a vertical direction.

In yet another example aspect, another video processing method is disclosed. The method includes determining that a differential coding mode used during a conversion between a current video block and a bitstream representation of the current video block is same as an intra coding mode associated with the current video block and performing the conversion between a current video block and a bitstream representation using an implementation rule of the differential coding mode.

In yet another example aspect, a video processing apparatus is disclosed. The apparatus includes a processor configured to perform an-above disclosed method.

In yet another example aspect, a computer readable medium is disclosed. The medium has code for processor-implementation of the above-described methods stored on it.

These, and other, aspects are described in the present document.

DETAILED DESCRIPTION

Figure 1:
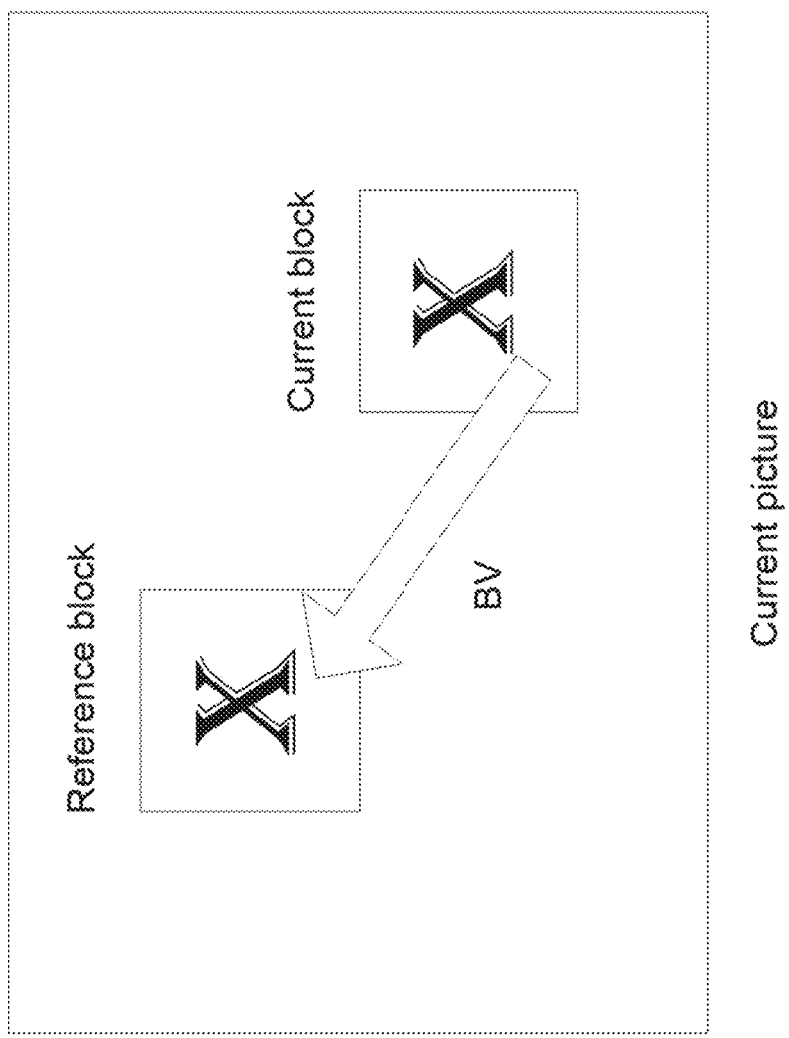
FIG. 1 is an illustration of Intra block copy.

Section headings are used in the present document to facilitate ease of understanding and do not limit the embodiments disclosed in a section to only that section. Furthermore, while certain embodiments are described with reference to Versatile Video Coding or other specific video codecs, the disclosed techniques are applicable to other video coding technologies also. Furthermore, while some embodiments describe video coding steps in detail, it will be understood that corresponding steps decoding that undo the coding will be implemented by a decoder. Furthermore, the term video processing encompasses video coding or compression, video decoding or decompression and video transcoding in which video pixels are represented from one compressed format into another compressed format or at a different compressed bitrate.

1. SUMMARY

This patent document is related to video coding technologies. Specifically, it is related to DPCM coding in video coding. It may be applied to the existing video coding standard like HEVC, or the standard Versatile Video Coding (VVC) to be finalized. It may be also applicable to future video coding standards or video codec.

2. INITIAL DISCUSSION

Video coding standards have evolved primarily through the development of the well-known ITU-T and ISO/IEC standards. The ITU-T produced H.261 and H.263, ISO/IEC produced MPEG-1 and MPEG-4 Visual, and the two organizations jointly produced the H.262/MPEG-2 Video and H.264/MPEG-4 Advanced Video Coding (AVC) and H.265/HEVC [1] standards. Since H.262, the video coding standards are based on the hybrid video coding structure wherein temporal prediction plus transform coding are utilized. To explore the future video coding technologies beyond HEVC, Joint Video Exploration Team (JVET) was founded by VCEG and MPEG jointly in 2015. Since then, many new methods have been adopted by JVET and put into the reference software named Joint Exploration Model (JEM) [3,4]. In April 2018, the Joint Video Expert Team (JVET) between VCEG (Q6/16) and ISO/IEC JTC1 SC29/WG11 (MPEG) was created to work on the VVC standard targeting at 50% bitrate reduction compared to HEVC.

The latest version of VVC draft, i.e., Versatile Video Coding (Draft 4) could be found at: phenix.it-sudparis.eu/jvet/doc_end_user/current_document.php?id=5755. The latest reference software of VVC, named VTM, could be found at: vcgit.hhi.fraunhofer.de/jvet/VVCSoftware_VTM/tags/VTM-4.0.

2.1 Intra Block Copy

Intra block copy (IBC), a.k.a., current picture referencing, has been adopted in HEVC Screen Content Coding extensions (HEVC-SCC) [1] and the current VVC test model (VTM-4.0). IBC extends the concept of motion compensation from inter-frame coding to intra-frame coding. As demonstrated in FIG. 1, the current block is predicted by a reference block in the same picture when IBC is applied. The samples in the reference block must have been already reconstructed before the current block is coded or decoded. Although IBC is not so efficient for most camera-captured sequences, it shows significant coding gains for screen content. The reason is that there are lots of repeating patterns, such as icons and text characters in a screen content picture. IBC can remove the redundancy between these repeating patterns effectively. In HEVC-SCC, an inter-coded coding unit (CU) can apply IBC if it chooses the current picture as its reference picture. The MV is renamed as block vector (BV) in this case, and a BV always has an integer-pixel precision. To be compatible with main profile HEVC, the current picture is marked as a "long-term" reference picture in the Decoded Picture Buffer (DPB). It should be noted that similarly, in multiple view/three dimensional (3D) video coding standards, the inter-view reference picture is also marked as a "long-term" reference picture.

Following a BV to find its reference block, the prediction can be generated by copying the reference block. The residual can be got by subtracting the reference pixels from the original signals. Then transform and quantization can be applied as in other coding modes.

FIG. 1 is an illustration of Intra block copy.

However, when a reference block is outside of the picture, or overlaps with the current block, or outside of the reconstructed area, or outside of the valid area restricted by some constrains, part or all pixel values are not defined. Basically, there are two solutions to handle such a problem. One is to disallow such a situation, e.g., in bitstream conformance.

The other is to apply padding for those undefined pixel values. The following sub-sessions describe the solutions in detail.

2.2 IBC in HEVC Screen Content Coding Extensions

In the screen content coding extensions of HEVC, when a block uses current picture as reference, it should guarantee that the whole reference block is within the available reconstructed area, as indicated in the following spec text:

The variables offsetX and offsetY are derived as follows:

$$\text{offset}X = (\text{ChromaArrayType}==0) ? 0 : \\ (mvCLX[0] \& 0x7 ? 2 : 0) \quad (0\text{-}1)$$

$$\text{offset}Y = (\text{ChromaArrayType}==0) ? 0 : \\ (mvCLX[1] \& 0x7 ? 2 : 0) \quad (0\text{-}2)$$

It is a requirement of bitstream conformance that when the reference picture is the current picture, the luma motion vector mvLX shall obey the following constraints:

When the derivation process for z-scan order block availability as specified in clause 6.4.1 is invoked with (xCurr, yCurr) set equal to (xCb, yCb) and the neighbouring luma location (xNbY, yNbY) set equal to (xPb+(mvLX[0]>>2)−offsetX, yPb+(mvLX[1]>>2)−offsetY) as inputs, the output shall be equal to TRUE.

When the derivation process for z-scan order block availability as specified in clause 6.4.1 is invoked with (xCurr, yCurr) set equal to (xCb, yCb) and the neighbouring luma location (xNbY, yNbY) set equal to (xPb+(mvLX[0]>>2)+nPbW−1+offsetX, yPb+(mvLX[1]>>2)+nPbH−1+offsetY) as inputs, the output shall be equal to TRUE.

One or both the following conditions shall be true:
The value of (mvLX[0]>>2)+nPbW+xB1+offsetX is less than or equal to 0.
The value of (mvLX[1]>>2)+nPbH+yB1+offsetY is less than or equal to 0.

The following condition shall be true:

$$(xPb+(mvLX[0]\gg2)+nPbSw-1+\text{offset}X)/CtbSizeY-x \\ Curr/CtbSizeY<=yCurr/CtbSizeY-(yPb+(mvLX \\ [1]\gg2)+nPbSh-1+\text{offset}Y)/CtbSizeY \quad (0\text{-}3)$$

Thus, the case that the reference block overlaps with the current block or the reference block is outside of the picture will not happen. There is no need to pad the reference or prediction block.

2.3 IBC in VVC Test Model

In the current VVC test model, i.e. VTM-4.0 design, the whole reference block should be with the current coding tree unit (CTU) and does not overlap with the current block. Thus, there is no need to pad the reference or prediction block. The IBC flag is coded as a prediction mode of the current CU. Thus, there are totally three prediction modes, MODE INTRA, MODE INTER and MODE IBC for each CU.

2.3.1 IBC Merge Mode

Figure 12:
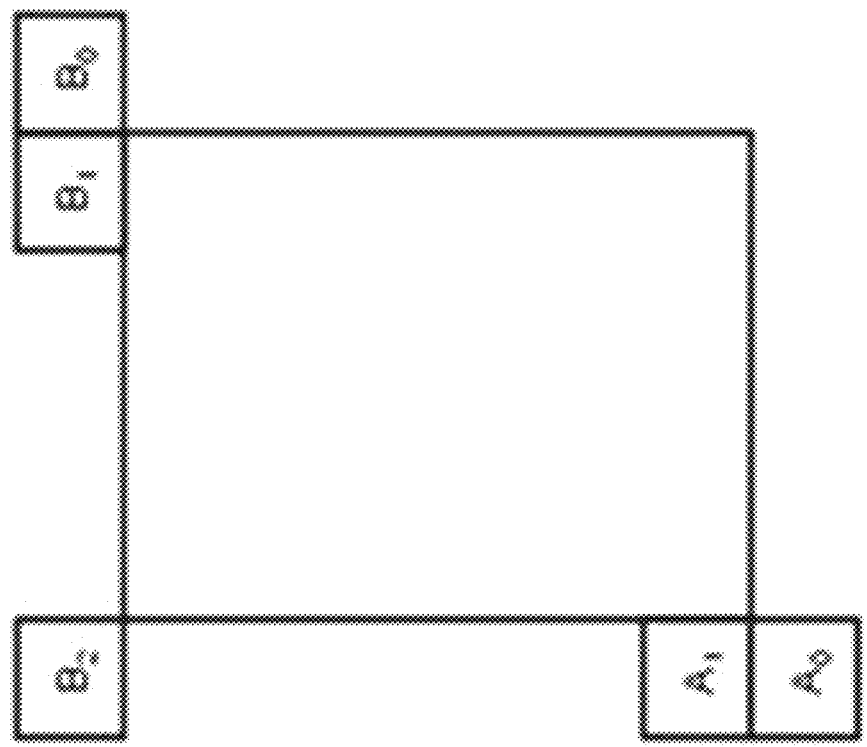
FIG. 12 shows an example of four merge candidates.
Figure 13:
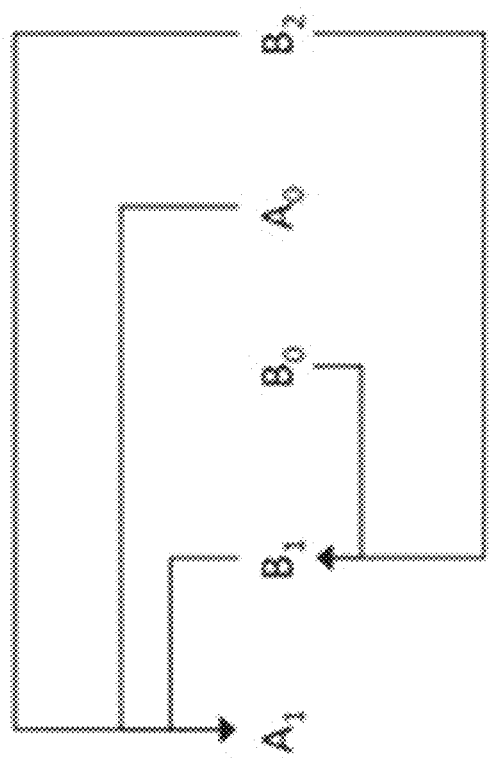
FIG. 13 shows example pairs of merge candidates used in video coding.

In IBC merge mode, an index pointing to an entry in the IBC merge candidates list is parsed from the bitstream. The construction of the IBC merge list can be summarized according to the following sequence of steps:

Step 1: Derivation of spatial candidates
Step 2: Insertion of History-based Motion Vector Prediction (HMVP) candidates
Step 3: Insertion of pairwise average candidates In the derivation of spatial merge candidates, a maximum of four merge candidates are selected among candidates located in the positions depicted in FIG. 12. The order of derivation is $A_1, B_1, B_0, A_0$ and $B_2$. Position $B_2$ is considered only when any PU of position $A_1, B_1, B_0, A_0$ is not available (e.g. because it belongs to another slice or tile) or is not coded with IBC mode. After candidate at position $A_1$ is added, the insertion of the remaining candidates is subject to a redundancy check which ensures that candidates with same motion information are excluded from the list so that coding efficiency is improved. To reduce computational complexity, not all possible candidate pairs are considered in the mentioned redundancy check. Instead only the pairs linked with an arrow in FIG. 13 are considered and a candidate is only added to the list if the corresponding candidate used for redundancy check has not the same motion information.

After insertion of the spatial candidates, if the IBC merge list size is still smaller than the maximum IBC merge list size, IBC candidates from HMVP table may be inserted. Redundancy check are performed when inserting the HMVP candidates.

Finally, pairwise average candidates are inserted into the IBC merge list.

When a reference block identified by a merge candidate is outside of the picture, or overlaps with the current block, or outside of the reconstructed area, or outside of the valid area restricted by some constrains, the merge candidate is called invalid merge candidate.

It is noted that invalid merge candidates may be inserted into the IBC merge list.

2.3.2 IBC AMVP Mode

In IBC advanced motion vector prediction (AMVP) mode, an AMVP index point to an entry in the IBC AMVP list is parsed from the bitstream. The construction of the IBC AMVP list can be summarized according to the following sequence of steps:

Step 1: Derivation of spatial candidates
 Check $A_0, A_1$ until an available candidate is found.
 Check $B_0, B_1, B_2$ until an available candidate is found.
Step 2: Insertion of HMVP candidates
Step 3: Insertion of zero candidates After insertion of the spatial candidates, if the IBC AMVP list size is still smaller than the maximum IBC AMVP list size, IBC candidates from HMVP table may be inserted.

Finally, zero candidates are inserted into the IBC AMVP list.

2.4 Palette Mode

Figure 2:
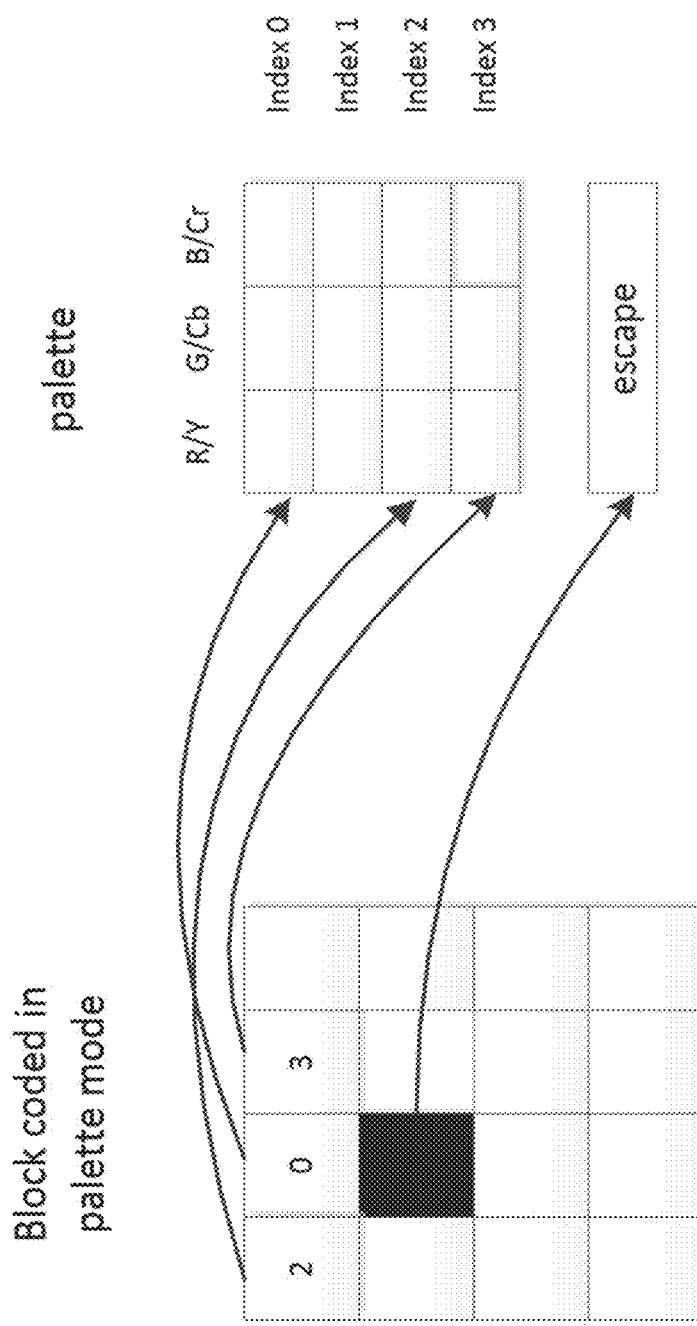
FIG. 2 shows an example of a block coded in palette mode.

The basic idea behind a palette mode is that the samples in the CU are represented by a small set of representative colour values. This set is referred to as the palette. It is also possible to indicate a sample that is outside the palette by signaling an escape symbol followed by (possibly quantized) component values. This is illustrated in FIG. 2.

2.5 Palette Mode in HEVC Screen Content Coding Extensions (HEVC-SCC)

In the palette mode in HEVC-SCC, a predictive way is used to code the palette and index map.

2.5.1 Coding of the Palette Entries

For coding of the palette entries, a palette predictor is maintained. The maximum size of the palette as well as the palette predictor is signaled in the sequence parameter set (SPS). In HEVC-SCC, a palette_predictor_initializer_present_flag is introduced in the picture parameter set (PPS). When this flag is 1, entries for initializing the palette predictor are signaled in the bitstream. The palette predictor is initialized at the beginning of each CTU row, each slice and each tile. Depending on the value of the palette_predictor_initializer_present_flag, the palette predictor is reset to 0 or initialized using the palette predictor intializer entries signaled in the PPS. In HEVC-SCC, a palette predictor initializer of size 0 was enabled to allow explicit disabling of the palette predictor initialization at the PPS level.

Figure 3:
FIG. 3 shows an example use of palette predictor to signal palette entries.

For each entry in the palette predictor, a reuse flag is signaled to indicate whether it is part of the current palette. This is illustrated in FIG. 3 The reuse flags are sent using run-length coding of zeros. After this, the number of new palette entries are signaled using exponential Golomb code of order 0. Finally, the component values for the new palette entries are signaled.

2.5.2 Coding of Palette Indices

Figure 4:
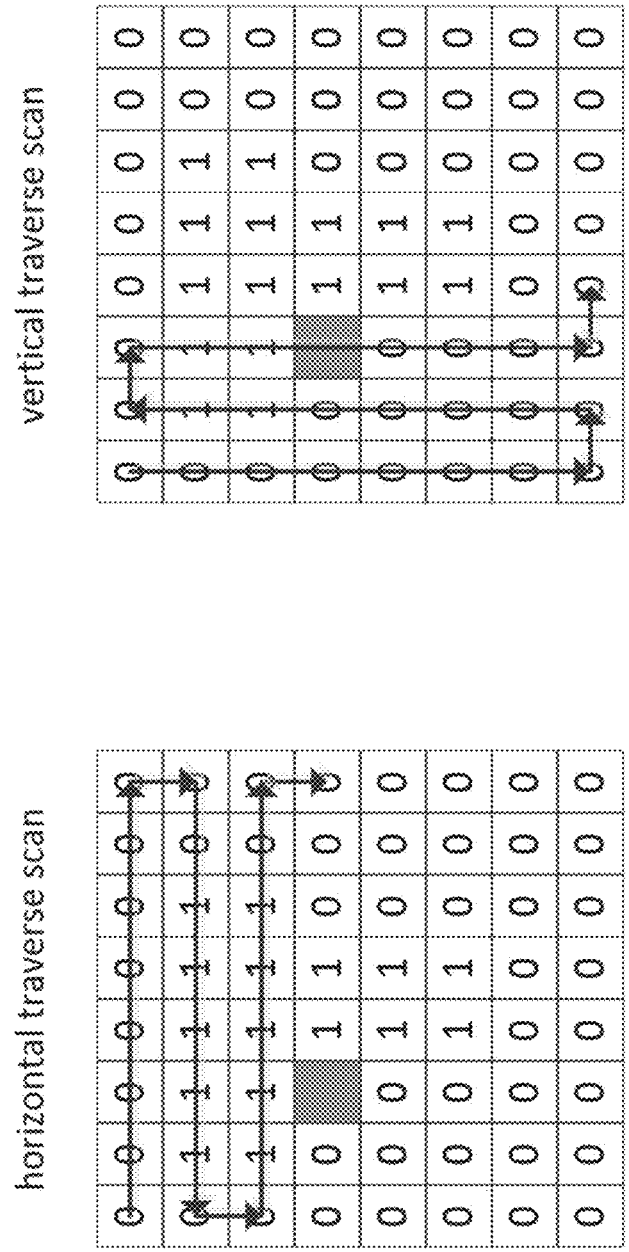
FIG. 4 shows examples of horizontal and vertical traverse scans.

The palette indices are coded using horizontal and vertical traverse scans as shown in FIG. 4. The scan order is explicitly signaled in the bitstream using the palette_transpose_flag. For the rest of the subsection it is assumed that the scan is horizontal.

Figure 5:
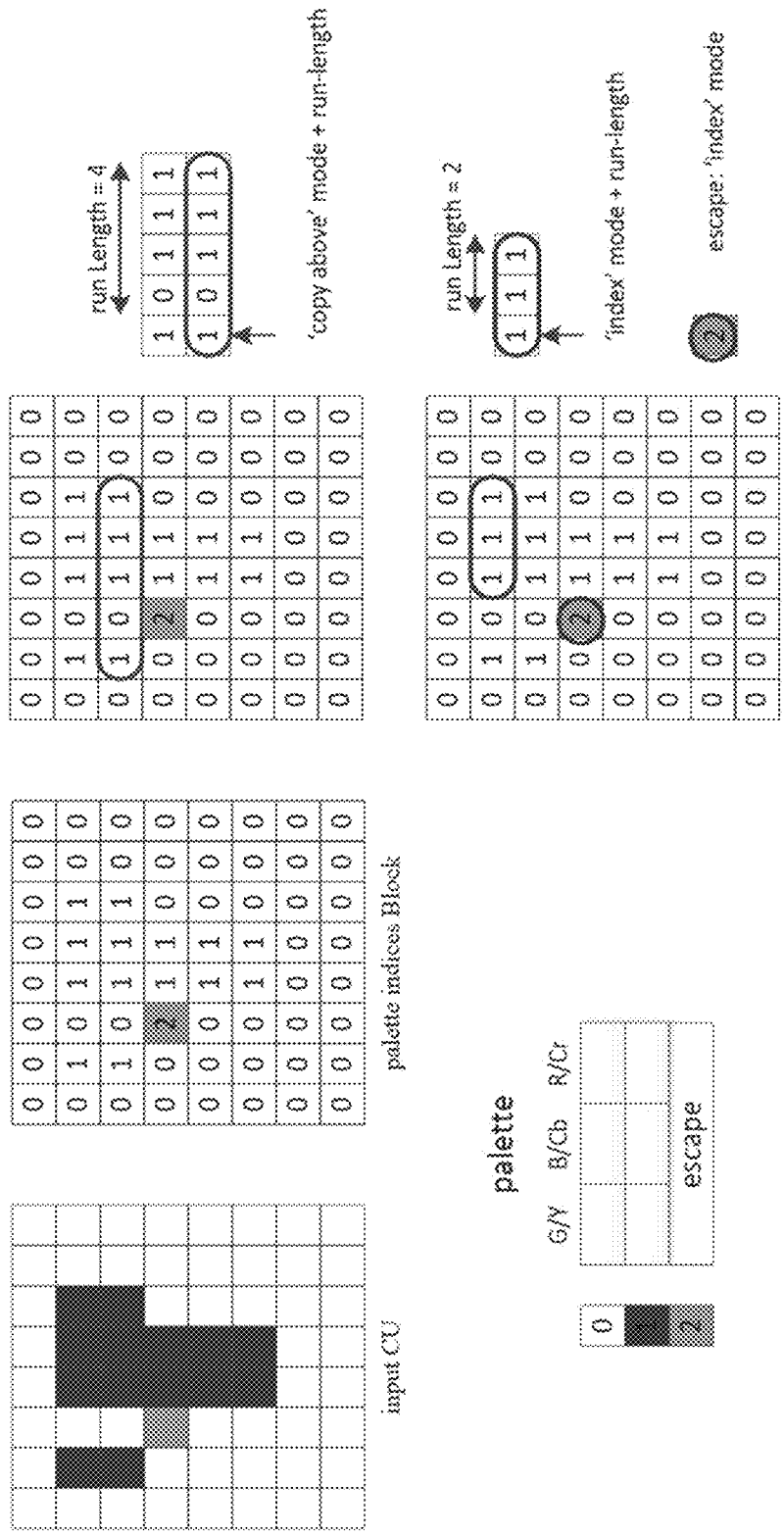
FIG. 5 shows an example of coding of palette indices.

The palette indices are coded using two main palette sample modes: 'INDEX' and 'COPY_ABOVE'. As explained previously, the escape symbol is also signaled as an 'INDEX' mode and assigned an index equal to the maximum palette size. The mode is signaled using a flag except for the top row or when the previous mode was 'COPY_ABOVE'. In the 'COPY_ABOVE' mode, the palette index of the sample in the row above is copied. In the 'INDEX' mode, the palette index is explicitly signaled. For both 'INDEX' and 'COPY_ABOVE' modes, a run value is signaled which specifies the number of subsequent samples that are also coded using the same mode. When escape symbol is part of the run in 'INDEX' or 'COPY_ABOVE' mode, the escape component values are signaled for each escape symbol. The coding of palette indices is illustrated in FIG. 5.

This syntax order is accomplished as follows. First, the number of index values for the CU is signaled. This is followed by signaling of the actual index values for the entire CU using truncated binary coding. Both the number of indices as well as the index values are coded in bypass mode. This groups the index-related bypass bins together. Then the palette sample mode (if necessary) and run are signaled in an interleaved manner. Finally, the component escape values corresponding to the escape samples for the entire CU are grouped together and coded in bypass mode.

An additional syntax element, last_run_type_flag, is signaled after signaling the index values. This syntax element, in conjunction with the number of indices, eliminates the need to signal the run value corresponding to the last run in the block.

In HEVC-SCC, the palette mode is also enabled for 4:2:2, 4:2:0, and monochrome chroma formats. The signaling of the palette entries and palette indices is almost identical for all the chroma formats. In case of non-monochrome formats, each palette entry consists of 3 components. For the monochrome format, each palette entry consists of a single component. For subsampled chroma directions, the chroma samples are associated with luma sample indices that are divisible by 2. After reconstructing the palette indices for the CU, if a sample has only a single component associated with it, only the first component of the palette entry is used. The only difference in signaling is for the escape component values. For each escape sample, the number of escape component values signaled may be different depending on the number of components associated with that sample.

2.6 Coefficients Coding in Transform Skip Mode

In JVET-M0464 and JVET-N0280, several modifications are proposed on the coefficients coding in transform skip (TS) mode in order to adapt the residual coding to the statistics and signal characteristics of the transform skip levels.

The proposed modifications are listed as follows.

No last significant scanning position: Since the residual signal reflects the spatial residual after the prediction and no energy compaction by transform is performed for TS, the higher probability for trailing zeros or insignificant levels at the bottom right corner of the transform block is not given anymore. Thus, last significant scanning position signaling is omitted in this case. Instead, the first subblock to be processed is the most bottom right subblock within the transform block Subblock CBFs: The absence of the last significant scanning position signaling requires the subblock coded block flag (CBF) signaling with coded_sub_block_flag for TS to be modified as follows:

Due to quantization, the aforementioned sequence of insignificance may still occur locally inside a transform block. Thus, the last significant scanning position is removed as described before and coded_sub_block_flag is coded for all sub-blocks.

The coded sub block flag for the subblock covering the direct current (DC) frequency position (top-left subblock) presents a special case. In VVC Draft 3, the coded_sub_block_flag for this subblock is never signaled and always inferred to be equal to 1. When the last significant scanning position is located in another subblock, it means that there is at least one significant level outside the DC subblock. Consequently, the DC subblock may contain only zero/non-significant levels although the coded_sub_block_flag for this subblock is inferred to be equal to 1. With the absence of the last scanning position information in TS, the coded_sub_block_flag for each subblock is signaled. This also includes the coded_sub_block_flag for the DC subblock except when all other coded_sub_block_flag syntax elements are already equal to 0. In this case, the DC coded_sub_block_flag is inferred to be equal to 1 (inferDcSbCbf=1). Since there has to be at least one significant level in this DC subblock, the sig_coeff_flag syntax element for the first position at (0,0) is not signaled and derived to be equal to 1 (inferSbDcSig- CoeffFlag=1) instead if all other sig_coeff_flag syntax elements in this DC subblock are equal to 0.

The context modeling for coded_sub_block_flag is changed. The context model index is calculated as the sum of the coded_sub_block_flag to the left and the coded_sub_block_flag abovess the current subblock instead of and a logical disjunction of both.

sig_coeff_flag context modelling: The local template in sig_coeff_flag context modeling is modified to only include the neighbor to the left ($NB_0$) and the neighbor above ($NB_1$) the current scanning position. The context model offset is just the number of significant neighboring positions sig_coeff_flag[$NB_0$]+sig_coeff_flag[$NB_1$]. Hence, the selection of different context sets depending on the diagonal d within the current transform block is removed. This results in three context models and a single context model set for coding the sig_coeff_flag flag.

abs_level_gt1_flag and par_level_flag context modelling: a single context model is employed for abs_level_gt1_flag and par_level_flag.

abs_remainder coding: Although the empirical distribution of the transform skip residual absolute levels typically still fits a Laplacian or a Geometrical distribution, there exist larger instationarities than for transform coefficient absolute levels. Particularly, the variance within a window of consecutive realization is higher for the residual absolute levels. This motivates the following modifications of the abs_remainder syntax binarization and context modelling:

Using a higher cutoff value in the binarization, i.e., the transition point from the coding with sig_coeff_flag, abs_level_gt1_flag, par_level_flag, and abs_level_gt3_flag to the Rice codes for abs_remainder, and dedicated context models for each bin position yields higher compression efficiency. Increasing the cutoff will result in more "greater than X" flags, e.g. introducing abs_level_gt5_flag, abs_level_gt7_flag, and so on until a cutoff is reached. The cutoff itself is fixed to 5 (numGtFlags=5).

The template for the rice parameter derivation is modified, i.e., only the neighbor to the left and the neighbor above the current scanning position are considered similar to the local template for sig_coeff_flag context modeling.

coeff_sign_flag context modelling: Due to the instationarities inside the sequence of signs and the fact that the prediction residual is often biased, the signs can be coded using context models, even when the global empirical distribution is almost uniformly distributed. A single dedicated context model is used for the coding of the signs and the sign is parsed after sig_coeff_flag to keep all context coded bins together.

2.7 Quantized Residual Block Differential Pulse-Code Modulation(QR-BDPCM)

In JVET-M0413, a quantized residual block differential pulse-code modulation (QR-BDPCM) is proposed to code screen contents efficiently.

The prediction directions used in QR-BDPCM can be vertical and horizontal prediction modes. The intra prediction is done on the entire block by sample copying in prediction direction (horizontal or vertical prediction) similar to intra prediction. The residual is quantized and the delta between the quantized residual and its predictor (horizontal or vertical) quantized value is coded. This can be described by the following: For a block of size M (rows)×N (cols), let $r_{i,j}$, $0 \leq i \leq M-1$, $0 \leq j \leq N-1$ be the prediction residual after performing intra prediction horizontally (copying left neighbor pixel value across the predicted block line by line) or vertically (copying top neighbor line to each line in the predicted block) using unfiltered samples from above or left block boundary samples. Let $Q(r_{i,j})$, $0 \leq i \leq M-1$, $0 \leq j \leq N-1$ denote the quantized version of the residual $r_{i,j}$, where residual is difference between original block and the predicted block values. Then the block DPCM is applied to the quantized residual samples, resulting in modified M×N array $\tilde{R}$ with elements $\tilde{r}_{i,j}$. When vertical BDPCM is signaled:

$$\tilde{r}_{i,j} = \begin{cases} Q(r_{i,j}), & i=0, 0 \leq j \leq (N-1) \\ Q(r_{i,j}) - Q(r_{(i-1),j}), & 1 \leq i \leq (M-1), 0 \leq j \leq (N-1) \end{cases} \quad (2\text{-}7\text{-}1)$$

For horizontal prediction, similar rules apply, and the residual quantized samples are obtained by:

$$\tilde{r}_{i,j} = \begin{cases} Q(r_{i,j}), & 0 \leq i \leq (M-1), j=0 \\ Q(r_{i,j}) - Q(r_{i,(j-1)}), & 0 \leq i \leq (M-1), 1 \leq j \leq (N-1) \end{cases} \quad (2\text{-}7\text{-}2)$$

The residual quantized samples $\tilde{r}_{i,j}$ are sent to the decoder.

On the decoder side, the above calculations are reversed to produce $Q(r_{i,j})$, $0 \leq i \leq M-1$, $0 \leq j \leq N-1$. For vertical prediction case, $$Q(r_{i,j}) = \Sigma_{k=0}^{i} \tilde{r}_{k,j}, \ 0 \leq i \leq (M-1), \ 0 \leq j \leq (N-1) \quad (2\text{-}7\text{-}3)$$

For horizontal case, $$Q(r_{i,j}) = \Sigma_{k=0}^{j} \tilde{r}_{i,k}, \ 0 \leq i \leq (M-1), \ 0 \leq j \leq (N-1) \quad (2\text{-}7\text{-}4)$$

The inverse quantized residuals, $Q^{-1}(Q(r_{i,j}))$, are added to the intra block prediction values to produce the reconstructed sample values.

The main benefit of this scheme is that the inverse DPCM can be done on the fly during coefficient parsing simply adding the predictor as the coefficients are parsed or it can be performed after parsing.

The draft text changes of QR-BDPCM are shown as follows.

7.3.6.5 Coding Unit Syntax

|  | Descriptor |
|---|---|
| coding_unit( x0, y0, cbWidth, cbHeight, treeType ) { | |
|   if( tile_group_type != I \|\| sps_ibc_enabled_flag ) { | |
|     if( treeType != DUAL_TREE_CHROMA ) | |
|       cu_skip_flag[ x0 ][ y0 ] | ae(v) |
|     if( cu_skip_flag[ x0 ][ y0 ] = = 0 && tile_group_type != I ) | |
|       pred_mode_flag | ae(v) |
|     if( ( ( tile_group_type = = I && cu_skip_flag[ x0 ][ y0 ] = =0 ) \|\| | |
|       ( tile_group_type != I && CuPredMode[ x0 ][ y0 ] != MODE_INTRA ) ) && | |
|       sps_ibc_enabled_flag ) | |
|       pred_mode_ibc_flag | ae(v) |
| } | |

| | Descriptor |
|---|---|
| if( CuPredMode[ x0 ][ y0 ] = = MODE_INTRA ) {<br>  if( pred_mode_flag = = MODE_INTRA && ( cIdx = = 0 ) &&<br>    ( cbWidth <= 32 ) && ( CbHeight <= 32 )) {<br>    bdpcm_flag[ x0 ][ y0 ] | ae(v) |
|     if( bdpcm_flag[ x0 ][ y0 ] ) {<br>      bdpcm_dir_flag[ x0 ][ y0 ] | ae(v) |
|     }<br>    else {<br>  if( sps_pcm_enabled_flag &&<br>    cbWidth >= MinIpcmCbSizeY && cbWidth <= MaxIpcmCbSizeY &&<br>    cbHeight >= MinIpcmCbSizeY && cbHeight <= MaxIpcmCbSizeY )<br>  pcm_flag[ x0 ][ y0 ] | ae(v) |
| if( pcm_flag[ x0 ][ y0 ] ) {<br>  while( !byte_aligned( ) )<br>    pcm_alignment_zero_bit | f(1) |
|   pcm_sample( cbWidth, cbHeight, treeType)<br>} else {<br>  if( treeType = = SINGLE_TREE || treeType = = DUAL_TREE_LUMA ) {<br>    if( ( y0 % CtbSizeY ) > 0 )<br>      intra_luma_ref_idx[ x0 ][ y0 ] | ae(v) |
|     if (intra_luma_ref_idx[ x0 ][ y0 ] = = 0 &&<br>      ( cbWidth <= MaxTbSizeY || cbHeight <= MaxTbSizeY ) &&<br>      ( cbWidth * cbHeight > MinTbSizeY * MinTbSizeY ))<br>      intra_subpartitions_mode_flag[ x0 ][ y0 ] | ae(v) |
|     if( intra_subpartitions_mode_flag[ x0 ][ y0 ] = = 1 &&<br>      cbWidth <= MaxTbSizeY && cbHeight <= MaxTbSizeY )<br>      intra_subpartitions_split_flag[ x0 ][ y0 ] | ae(v) |
|     if( intra_luma_ref_idx[ x0 ][ y0 ] = = 0 &&<br>      intra_subpartitions_mode_flag[ x0 ][ y0 ] = = 0 )<br>      intra_luma_mpm_flag[ x0 ][ y0 ] | ae(v) |
|     if( intra_luma_mpm_flag[ x0 ][ y0 ] )<br>      intra_luma_mpm_idx[ x0 ][ y0 ] | ae(v) |
|     else<br>      intra_luma_mpm_remainder[ x0 ][ y0 ] | ae(v) |
|   }<br>}<br>if( treeType = = SINGLE_TREE || treeType = = DUAL_TREE_CHROMA )<br>  intra_chroma_pred_mode[ x0 ][ y0 ] | ae(v) |
|   }<br>} else if( treeType != DUAL_TREE_CHROMA ) { /* MODE_INTER or MODE_IBC */<br>...<br>} | | bdpcm_flag[x0][y0] equal to 1 specifies that a bdpcm_dir_flag is present in the coding unit including the luma coding block at the location (x0, y0)

bdpcm_dir_flag[x0][y0] equal to 0 specifies that the prediction direction to be used in a bdpcm block is horizontal, otherwise it is vertical.

8.4.2 Derivation Process for Luma Intra Prediction Mode

Input to this process are:

a luma location (xCb, yCb) specifying the top-left sample of the current luma coding block relative to the top-left luma sample of the current picture, a variable cbWidth specifying the width of the current coding block in luma samples, a variable cbHeight specifying the height of the current coding block in luma samples.

In this process, the luma intra prediction mode IntraPredModeY[xCb][yCb] is derived.

Table 8-1 specifies the value for the intra prediction mode IntraPredModeY[xCb][yCb] and the associated names.

TABLE 8-1

Specification of intra prediction mode and associated names

| Intra prediction mode | Associated name |
|---|---|
| 0 | INTRA_PLANAR |
| 1 | INTRA_DC |
| 2 . . . 66 | INTRA_ANGULAR2 . . . INTRA_ANGULAR66 |
| 81 . . . 83 | INTRA_LT_CCLM, INTRA_L_CCLM, INTRA_T_CCLM |

NOTE:
The intra prediction modes INTRA_LT_CCLM, INTRA_L_CCLM and INTRA_T_CCLM are only applicable to chroma components.

IntraPredModeY[xCb][yCb] is derived by the following ordered steps:

The neighbouring locations (xNbA, yNbA) and (xNbB, yNbB) are set equal to (xCb−1, yCb+cbHeight−1) and (xCb+cbWidth−1, yCb−1), respectively.

For X being replaced by either A or B, the variables candIntraPredModeX are derived as follows: . . .

The variables ispDefaultMode1 and ispDefaultMode2 are defined as follows: . . .

The candModeList[x] with x=0 . . . 5 is derived as follows: . . .

IntraPredModeY[xCb][yCb] is derived by applying the following procedure:

If bdpcm_flag[xCb][yCb] is equal to 1, the IntraPred-
ModeY[xCb][yCb] is set equal to candModeList[0].
Otherwise if intra_luma_mpm_flag[xCb][yCb] is equal
to 1, the IntraPredModeY[xCb][yCb] is set equal to
candModeList[intra_luma_mpm_idx[xCb][yCb]].
Otherwise, IntraPredModeY[xCb][yCb] is derived by
applying the following ordered steps:
The variable IntraPredModeY[x][y] with x=xCb . . . xCb+
cbWidth−1 and y=yCb . . . yCb+cbHeight−1 is set to be
equal to IntraPredModeY[xCb][yCb].

2.8 Matrix Based Intra Prediction (MIP)

The matrix based intra prediction is also called affine
linear weighted intra prediction (ALWIP), which use a
weighted matrix to derive the intra prediction signal.

2.8.1 Description of the Method

For predicting the samples of a rectangular block of width
W and height H, affine linear weighted intra prediction
(ALWIP) takes one line of H reconstructed neighbouring
boundary samples left of the block and one line of W
reconstructed neighbouring boundary samples above the
block as input. If the reconstructed samples are unavailable,
they are generated as it is done in the conventional intra
prediction.

The generation of the prediction signal is based on the
following three steps:
1. Out of the boundary samples, four samples in the case
   of W=H=4 and eight samples in all other cases are
   extracted by averaging.
2. A matrix vector multiplication, followed by addition of
   an offset, is carried out with the averaged samples as an
   input. The result is a reduced prediction signal on a
   subsampled set of samples in the original block.
3. The prediction signal at the remaining positions is
   generated from the prediction signal on the subsampled
   set by linear interpolation which is a single step linear
   interpolation in each direction.

The matrices and offset vectors needed to generate the
prediction signal are taken from three sets $S_0$, $S_1$, $S_2$ of
matrices. The set $S_0$ consists of 18 matrices $A_0^i$, $i \in$
$\{0, \ldots, 17\}$ each of which has 16 rows and 4 columns and
18 offset vectors $b_0^i$, $i \in \{0, \ldots, 17\}$ each of size 16. Matrices
and offset vectors of that set are used for blocks of size 4×4.
The set $S_1$ consists of 10 matrices $A_1^i$, $i \in \{0, \ldots, 9\}$, each
of which has 16 rows and 8 columns and 10 offset vectors
$b_1^i$, $i \in \{0, \ldots, 9\}$ each of size 16. Matrices and offset vectors
of that set are used for blocks of sizes 4×8, 8×4 and 8×8.
Finally, the set $S_2$ consists of 6 matrices $A_2^i$, $i \in \{0, \ldots, 5\}$,
each of which has 64 rows and 8 columns and of 6 offset
vectors $b_2^i$, $i \in \{0, \ldots, 5\}$ of size 64. Matrices and offset
vectors of that set or parts of these matrices and offset
vectors are used for all other block-shapes.

The total number of multiplications needed in the com-
putation of the matrix vector product is always smaller than
or equal to 4·W·H. In other words, at most four multiplica-
tions per sample are required for the ALWIP modes.

2.8.2 Averaging of the Boundary

In a first step, the input boundaries $bdry^{top}$ and $bdry^{left}$ are
reduced to smaller boundaries $bdry_{red}^{top}$ and $bdry_{red}^{left}$.
Here, $bdry_{red}^{top}$ and $bdry_{red}^{left}$ both consists of 2 samples in
the case of a 4×4-block and both consist of 4 samples in all
other cases.

In the case of a 4×4-block, for $0 \leq i < 2$, one defines:

$$bdry_{red}^{top}[i] = \left(\left(\sum_{j=0}^{1} bdry^{top}[i \cdot 2 + j]\right) + 1\right) \gg 1$$

and defines $bdry_{red}^{left}$ analogously.

Otherwise, if the block-width W is given as $W = 4 \cdot 2^k$, for
$0 \leq i < 4$, one defines:

$$bdry_{red}^{top}[i] = \left(\left(\sum_{j=0}^{2^k-1} bdry^{top}[i \cdot 2^k + j]\right) + (1 \ll (k-1))\right) \gg k$$

and defines $bdry_{red}^{left}$ analogously.

The two reduced boundaries $bdry_{red}^{top}$ and $bdry_{red}^{left}$ are
concatenated to a reduced boundary vector $bdry_{red}$ which is
thus of size four for blocks of shape 4×4 and of size eight for
blocks of all other shapes. If mode refers to the ALWIP-
mode, this concatenation is defined as follows:

$$bdry_{red} = \begin{cases} [bdry_{red}^{top}, bdry_{red}^{left}] & \text{for } W = H = 4 \text{ and mode} < 18 \\ [bdry_{red}^{left}, bdry_{red}^{top}] & \text{for } W = H = 4 \text{ and mode} \geq 18 \\ [bdry_{red}^{top}, bdry_{red}^{left}] & \text{for } \max(W, H) = 8 \text{ and mode} < 10 \\ [bdry_{red}^{left}, bdry_{red}^{top}] & \text{for } \max(W, H) = 8 \text{ and mode} \geq 10 \\ [bdry_{red}^{top}, bdry_{red}^{left}] & \text{for } \max(W, H) > 8 \text{ and mode} < 6 \\ [bdry_{red}^{left}, bdry_{red}^{top}] & \text{for } \max(W, H) > 8 \text{ and mode} \geq 6 \end{cases}$$

Finally, for the interpolation of the subsampled prediction
signal, on large blocks a second version of the averaged
boundary is needed. Namely, if $\min(W, H) > 8$ and $W \geq H$, one
writes $W = 8 * 2^l$, and, for $0 \leq i < 8$, defines:

$$bdry_{redII}^{top}[i] = \left(\left(\sum_{j=0}^{2^l-1} bdry^{top}[i \cdot 2^l + j]\right) + (1 \ll (l-1))\right) \gg l.$$

If $\min(W, H) > 8$ and $H > W$, one defines $bdry_{redII}^{left}$ analo-
gously.

2.8.3 Generation of the Reduced Prediction Signal by Matrix Vector Multiplication Out of the reduced input vector $bdry_{red}$ one generates a
reduced prediction signal $pred_{red}$. The latter signal is a signal
on the downsampled block of width $W_{red}$ and height $H_{red}$.
Here, $W_{red}$ and $H_{red}$ are defined as:

$$W_{red} = \begin{cases} 4 & \text{for } \max(W, H) \leq 8 \\ \min(W, 8) & \text{for } \max(W, H) > 8 \end{cases}$$

$$H_{red} = \begin{cases} 4 & \text{for } \max(W, H) \leq 8 \\ \min(H, 8) & \text{for } \max(W, H) > 8 \end{cases}$$

The reduced prediction signal $pred_{red}$ is computed by
calculating a matrix vector product and adding an offset:

$pred_{red} = A \cdot bdry_{red} + b.$

Here, A is a matrix that has $W_{red} \cdot H_{red}$ rows and 4 columns
if W=H=4 and 8 columns in all other cases. b is a vector of
size $W_{red} \cdot H_{red}$.

The matrix A and the vector b are taken from one of the sets $S_0$, $S_1$, $S_2$ as follows. One defines an index idx=idx(W, H) as follows:

$$idx(W, H) = \begin{cases} 0 & \text{for } W = H = 4 \\ 1 & \text{for } \max(W, H) = 8 \\ 2 & \text{for } \max(W, H) > 8 \end{cases}.$$

Moreover, one puts m as follows:

$$m = \begin{cases} \text{mode} & \text{for } W = H = 4 \text{ and mode} < 18 \\ \text{mode} - 17 & \text{for } W = H = 4 \text{ and mode} \geq 18 \\ \text{mode} & \text{for } \max(W, H) = 8 \text{ and mode} < 10 \\ \text{mode} - 9 & \text{for } \max(W, H) = 8 \text{ and mode} \geq 10 \\ \text{mode} & \text{for } \max(W, H) > 8 \text{ and mode} < 6 \\ \text{mode} - 5 & \text{for } \max(W, H) > 8 \text{ and mode} \geq 6 \end{cases}.$$

Then, if idx≤1 or idx=2 and min(W, H)>4, one puts $A=A_{idx}^m$ and $b=b_{idx}^m$. In the case that idx=2 and min(W, H)=4, one lets A be the matrix that arises by leaving out every row of $A_{idx}^m$ that, in the case W=4, corresponds to an odd x-coordinate in the downsampled block, or, in the case H=4, corresponds to an odd y-coordinate in the downsampled block.

Finally, the reduced prediction signal is replaced by its transpose in the following cases:
W=H=4 and mode≥18
max(W, H)=8 and mode≥10
max(W, H)>8 and mode≥6

The number of multiplications required for calculation of $pred_{red}$ is 4 in the case of W=H=4 since in this case A has 4 columns and 16 rows. In all other cases, A has 8 columns and $W_{red} \cdot H_{red}$ rows and one immediately verifies that in these cases $8 \cdot W_{red} \cdot H_{red} \leq 4 \cdot W \cdot H$ multiplications are required, i.e. also in these cases, at most 4 multiplications per sample are needed to compute $pred_{red}$.

2.8.4 Illustration of the Entire ALWIP Process

Figure 6:
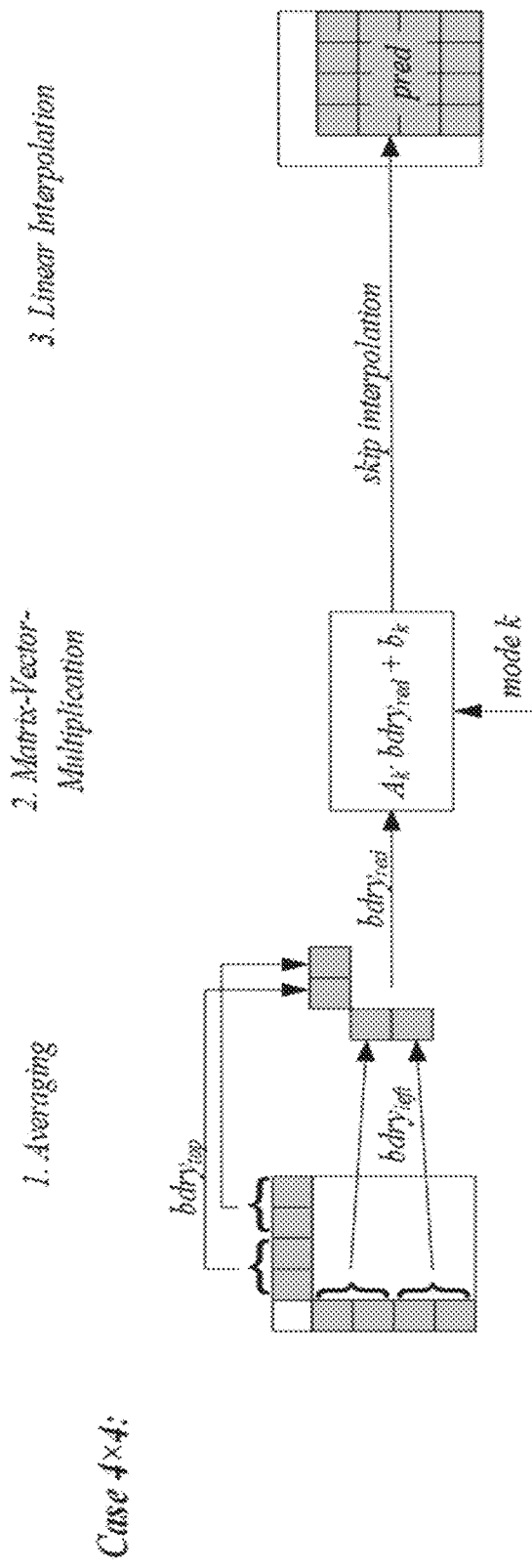
FIG. 6 shows an example process of affine linear weighted intra prediction (ALWIP) process.
Figure 7:
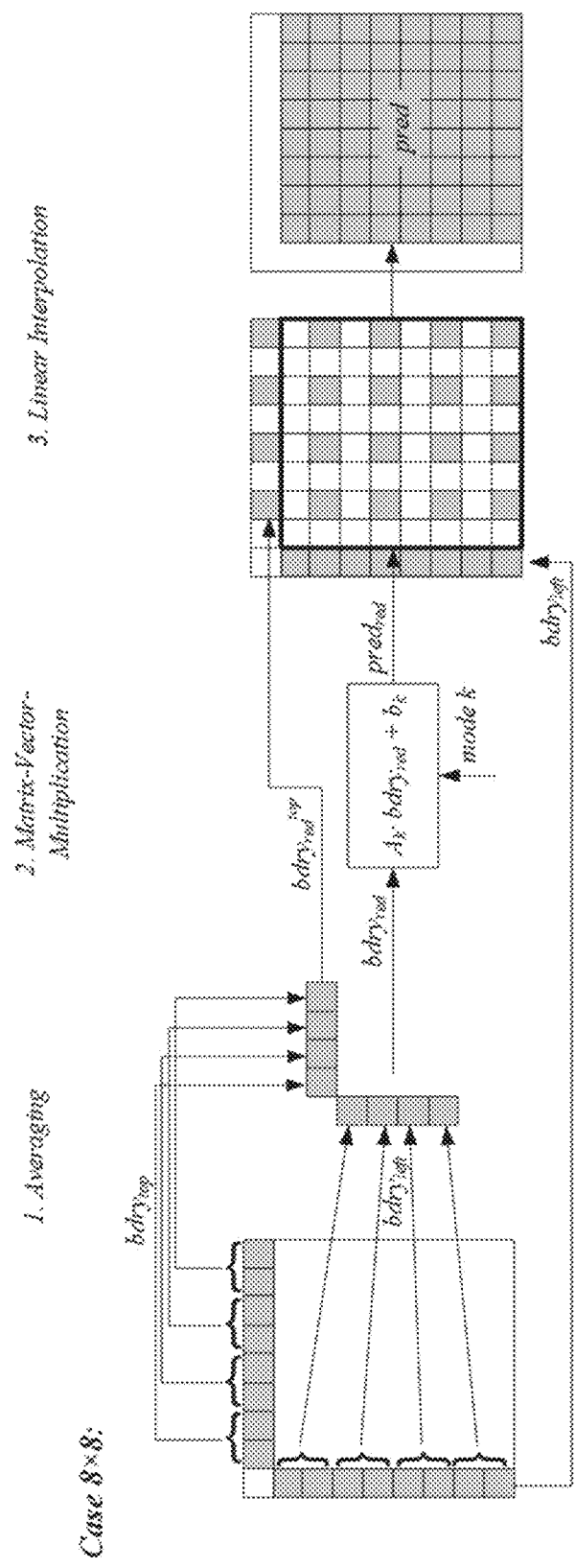
FIG. 7 shows an example process of affine linear weighted intra prediction (ALWIP) process.
Figure 8:
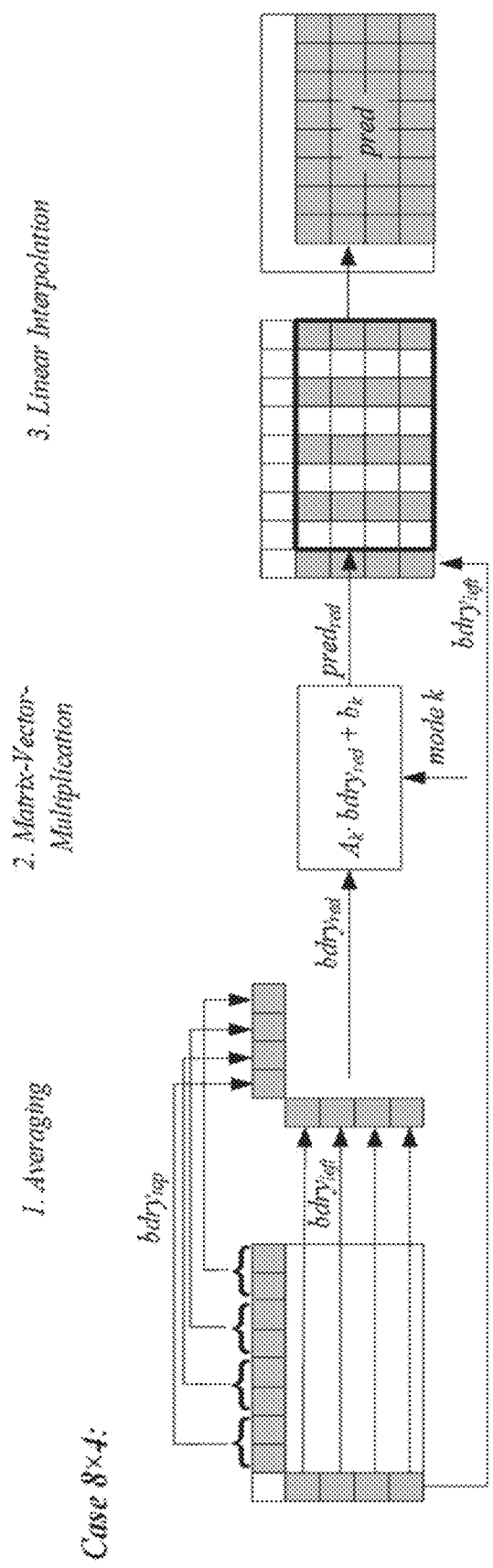
FIG. 8 shows an example process of affine linear weighted intra prediction (ALWIP) process.
Figure 9:
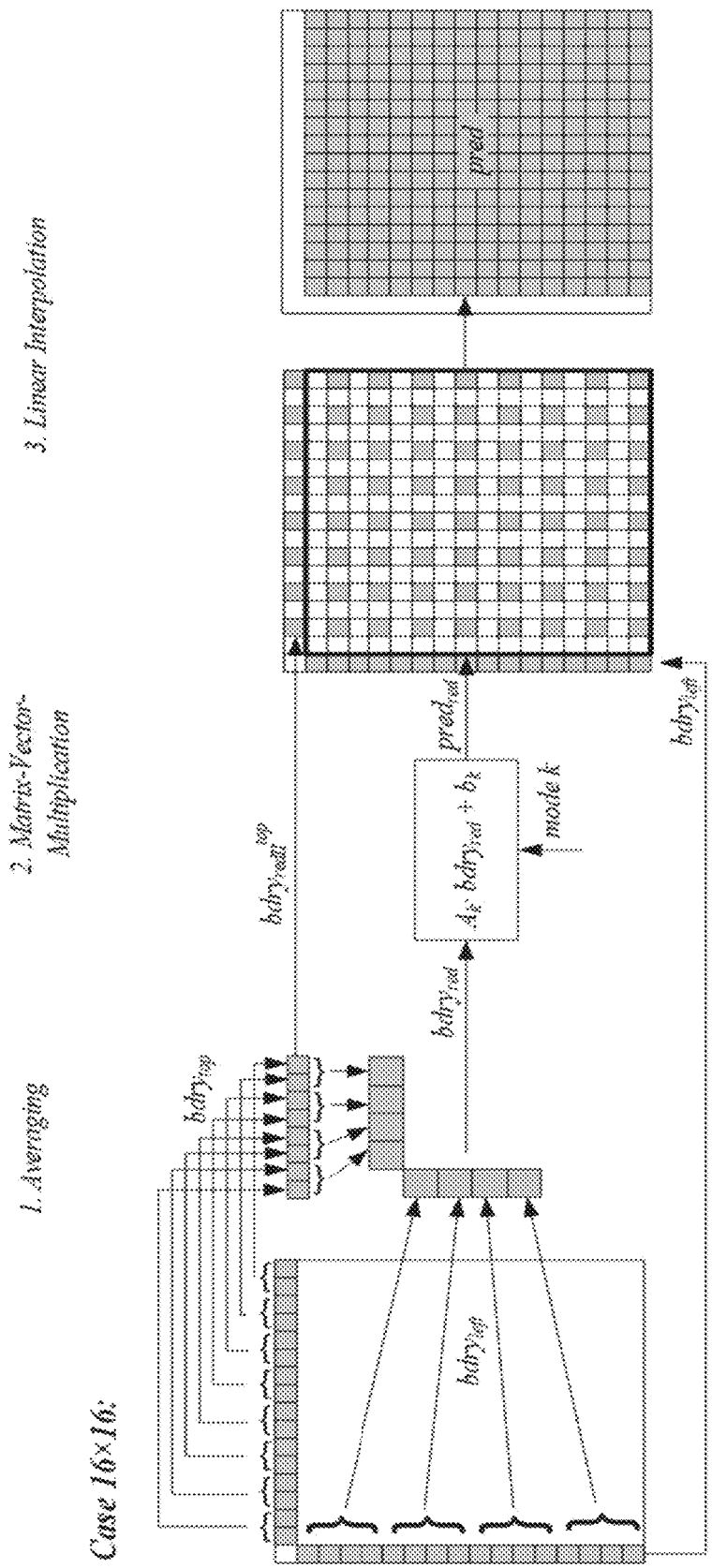
FIG. 9 shows an example process of affine linear weighted intra prediction (ALWIP) process.

The entire process of averaging, matrix vector multiplication and linear interpolation is illustrated for different shapes in FIG. 6, FIG. 7, FIG. 8 and FIG. 9. Note, that the remaining shapes are treated as in one of the depicted cases.
1. Given a 4×4 block, ALWIP takes two averages along each axis of the boundary. The resulting four input samples enter the matrix vector multiplication. The matrices are taken from the set $S_0$. After adding an offset, this yields the 16 final prediction samples. Linear interpolation is not necessary for generating the prediction signal. Thus, a total of (4·16)/(4·4)=4 multiplications per sample are performed.
FIG. 6 is an illustration of ALWIP for 4×4 blocks.
2. Given an 8×8 block, ALWIP takes four averages along each axis of the boundary. The resulting eight input samples enter the matrix vector multiplication. The matrices are taken from the set $S_1$. This yields 16 samples on the odd positions of the prediction block. Thus, a total of (8·16)/(8·8)=2 multiplications per sample are performed. After adding an offset, these samples are interpolated vertically by using the reduced top boundary. Horizontal interpolation follows by using the original left boundary.
FIG. 7 is an illustration of ALWIP for 8×8 blocks.
3. Given an 8×4 block, ALWIP takes four averages along the horizontal axis of the boundary and the four original boundary values on the left boundary. The resulting eight input samples enter the matrix vector multiplication. The matrices are taken from the set $S_1$. This yields 16 samples on the odd horizontal and each vertical positions of the prediction block. Thus, a total of (8·16)/(8·4)=4 multiplications per sample are performed. After adding an offset, these samples are interpolated horizontally by using the original left boundary.
FIG. 8 is an illustration of ALWIP for 8×4 blocks.
The transposed case is treated accordingly.
4. Given a 16×16 block, ALWIP takes four averages along each axis of the boundary. The resulting eight input samples enter the matrix vector multiplication. The matrices are taken from the set $S_2$. This yields 64 samples on the odd positions of the prediction block. Thus, a total of (8·64)/(16·16)=2 multiplications per sample are performed. After adding an offset, these samples are interpolated vertically by using eight averages of the top boundary. Horizontal interpolation follows by using the original left boundary.
FIG. 9 is an illustration of ALWIP for 16×16 blocks.

For larger shapes, the procedure is essentially the same and it is easy to check that the number of multiplications per sample is less than four.

For W×8 blocks with W>8, only horizontal interpolation is necessary as the samples are given at the odd horizontal and each vertical position. In this case, (8·64)/(W·8)=64/W multiplications per sample are performed to calculate the reduced prediction. Finally for W×4 blocks with W>8, let $A_k$ be the matrix that arises by leaving out every row that corresponds to an odd entry along the horizontal axis of the downsampled block. Thus, the output size is 32 and again, only horizontal interpolation remains to be performed. For calculation of reduced prediction, (8·32)/(W·4)=64/W multiplications per sample are performed. For W=16, no additional multiplications are required while, for W>16, less than 2 multiplication per sample are needed for linear interpolation. Thus, total number of multiplications is less than or equal to four.

The transposed cases are treated accordingly.

2.8.5 Single Step Linear Interpolation

For a W×H block with max(W, H)≥8, the prediction signal arises from the reduced prediction signal $pred_{red}$ on $W_{red} \times H_{red}$ by linear interpolation. Depending on the block shape, linear interpolation is done in vertical, horizontal or both directions. If linear interpolation is to be applied in both directions, it is first applied in horizontal direction if W<H and it is first applied in vertical direction, else.

Consider without loss of generality a W×H block with max(W, H)≥8 and W≥H. Then, the one-dimensional linear interpolation is performed as follows. Without loss of generality, it suffices to describe linear interpolation in vertical direction. First, the reduced prediction signal is extended to the top by the boundary signal. Define the vertical upsampling factor $U_{ver}=H/H_{red}$ and write $U_{ver}=2^{u_{ver}}>1$. Then, define the extended reduced prediction signal by:

$$pred_{red}[x][-1] = \begin{cases} bdry_{red}^{top}[x] & \text{for } W = 8 \\ bdry_{redII}^{top}[x] & \text{for } W > 8 \end{cases}.$$

Then, from this extended reduced prediction signal, the vertically linear interpolated prediction signal is generated by:

$$pred_{red}^{ups,ver}[x][U_{ver} \cdot y + k] =$$
$$\left((U_{ver} - k - 1) \cdot pred_{red}[x][y-1] + (k+1) \cdot pred_{red}[x][y] + \frac{U_{ver}}{2}\right) \gg u_{ver}$$

for $0 \le x < W_{red}, 0 \le y < H_{red}$ and $0 \le k < U_{ver}$.

bit-shift-only linear interpolation algorithm does not require any multiplication.

2.8.6 Signalization of the Proposed Intra Prediction Modes

For each Coding Unit (CU) in intra mode, a flag indicating if an ALWIP mode is to be applied on the corresponding Prediction Unit (PU) or not is sent in the bitstream. If an ALWIP mode is to be applied, the index predmode of the ALWIP mode is signaled using a most probable mode (MPM)-list with 3 MPMs.

Here, the derivation of the MPMs is performed using the intra-modes of the above and the left PU as follows. There are three fixed tables map_angular_to_alwip$_{idx}$, idx$\in$ {0,1,2} that assign to each conventional intra prediction mode predmode$_{Angular}$ an ALWIP mode:

predmode$_{ALWIP}$=map_angular_to_alwip$_{idx}$[predmode$_{Angular}$].

For each PU of width W and height H one defines an index:

idx(PU)=idx(W,H)$\in$ {0,1,2} that indicates from which of the three sets the ALWIP-parameters are to be taken as in Section 1.3 above.

If the above Prediction Unit PU$_{above}$ is available, belongs to the same CTU as the current PU and is in intra mode, if idx(PU)=idx(PU$_{above}$) and if ALWIP is applied on PU$_{above}$ with ALWIP-mode predmode$_{ALWIP}^{above}$, one puts:

mode$_{ALWIP}^{above}$=predmode$_{ALWIP}^{above}$.

If the above PU is available, belongs to the same CTU as the current PU and is in intra mode and if a conventional intra prediction mode predmode$_{Angular}^{above}$ is applied on the above PU, one puts:

mode$_{ALWIP}^{above}$=map_angular_to_alwip$_{idx(PU_{above})}$[predmode$_{Angular}^{above}$].

In all other cases, one puts:

mode$_{ALWIP}^{above}$=-1 which means that this mode is unavailable. In the same way but without the restriction that the left PU needs to belong to the same CTU as the current PU, one derives a mode mode$_{ALWIP}^{left}$.

Finally, three fixed default lists list$_{idx}$, idx$\in$ {0,1,2} are provided, each of which contains three distinct ALWIP modes. Out of the default list list$_{idx(PU)}$ and the modes mode$_{ALWIP}^{above}$ and mode$_{ALWIP}^{left}$, one constructs three distinct MPMs by substituting -1 by default values as well as eliminating repetitions.

2.8.7 Adapted MPM-List Derivation for Conventional Luma and Chroma Intra-Prediction Modes The proposed ALWIP-modes are harmonized with the MPM-based coding of the conventional intra-prediction modes as follows. The luma and chroma MPM-list derivation processes for the conventional intra-prediction modes uses fixed tables map_alwip_to_angular$_{idx}$, idx$\in$ {0,1,2}, mapping an ALWIP-mode predmode$_{ALWIP}$ on a given PU to one of the conventional intra-prediction modes:

predmode$_{Angular}$=map_alwip_to_angular$_{idx(PU)}$[predmode$_{ALWIP}$].

For the luma MPM-list derivation, whenever a neighboring luma block is encountered which uses an ALWIP-mode predmode$_{ALWIP}$, this block is treated as if it was using the conventional intra-prediction mode predmode$_{Angular}$. For the chroma MPM-list derivation, whenever the current luma block uses an LWIP-mode, the same mapping is used to translate the ALWIP-mode to a conventional intra prediction mode.

2.9 Intra Mode Coding with 67 Intra Prediction Modes

Figure 14:
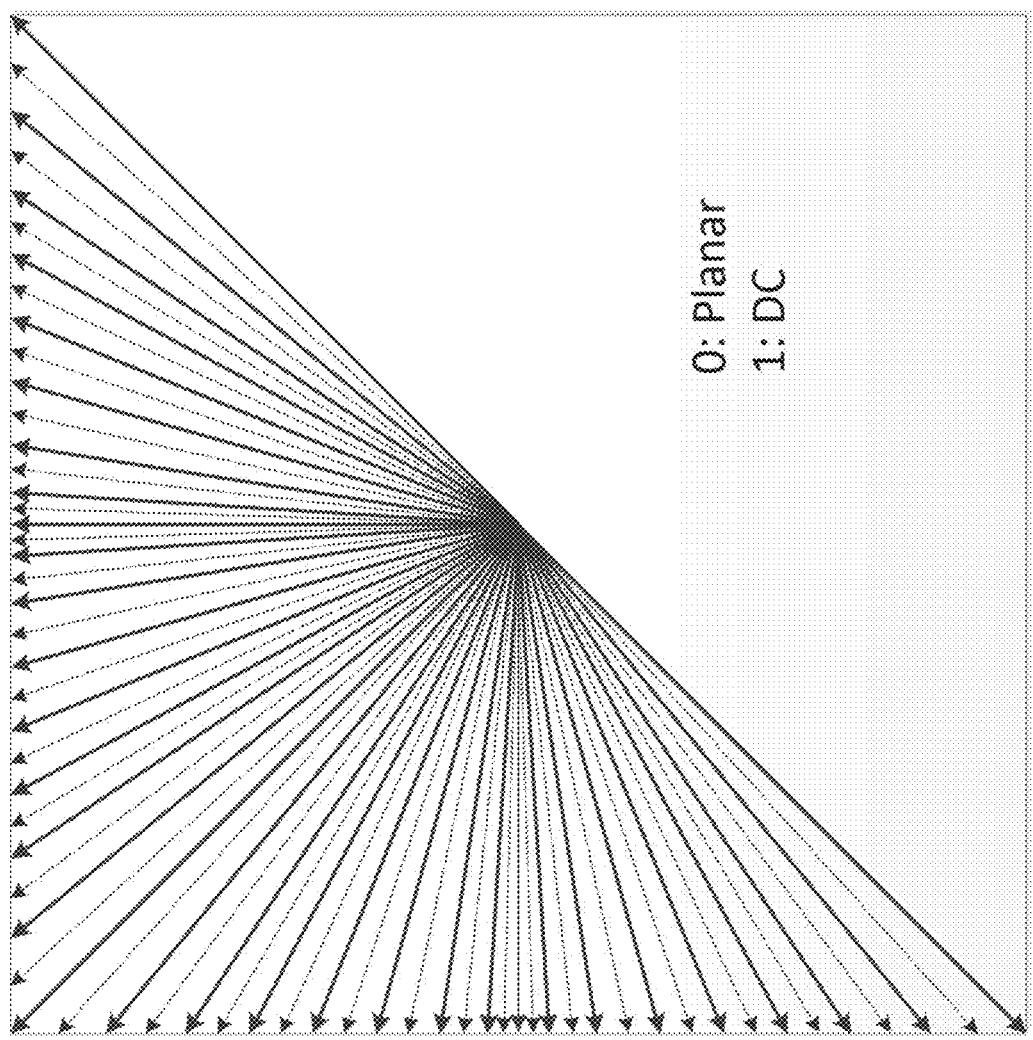
FIG. 14 shows an example of 67 intra prediction modes.

To capture the arbitrary edge directions presented in natural video, the number of directional intra modes in VTM4 is extended from 33, as used in HEVC, to 65. The new directional modes not in HEVC are depicted as red dotted arrows in FIG. 14, and the planar and DC modes remain the same. These denser directional intra prediction modes apply for all block sizes and for both luma and chroma intra predictions.

A unified 6-MPM list is proposed for intra blocks irrespective of whether MRL and ISP coding tools are applied or not. The MPM list is constructed based on intra modes of the left and above neighboring block as in VTM4.0. Suppose the mode of the left is denoted as Left and the mode of the above block is denoted as Above, the unified MPM list is constructed as follows:

When a neighboring block is not available, its intra mode is set to Planar by default.

If both modes Left and Above are non-angular modes:

MPM list→{Planar, DC, V, H, V-4, V+4}

If one of modes Left and Above is angular mode, and the other is non-angular:

Set a mode Max as the larger mode in Left and Above

MPM list→{Planar, Max, DC, Max -1, Max +1, Max -2}

If Left and Above are both angular and they are different:

Set a mode Max as the larger mode in Left and Above if the difference of mode Left and Above is in the range of 2 to 62, inclusive MPM list→{Planar, Left, Above, DC, Max -1, Max +1}

Otherwise

MPM list→{Planar, Left, Above, DC, Max -2, Max +2}

If Left and Above are both angular and they are the same:

MPM list→{Planar, Left, Left -1, Left +1, DC, Left -2}

7.3.6.5 Coding Unit Syntax

|  | Descriptor |
|---|---|
| coding_unit( x0, y0, cbWidth, cbHeight, treeType ) { | |
|   if( tile_group_type != I \|\| sps_ibc_enabled_flag ) { | |
|     if( treeType != DUAL_TREE_CHROMA ) | |
|       cu_skip_flag[ x0 ][ y0 ] | ae(v) |
|     if( cu_skip_flag[ x0 ][ y0 ] = = 0 && tile_group_type != I ) | |
|       pred_mode_flag | ae(v) |
|     if( ( ( tile_group_type = = I && cu_skip_flag[ x0 ][ y0 ] = =0 ) \|\| | |
|       ( tile_group_type != I && CuPredMode[ x0 ][ y0 ] != MODE_INTRA ) ) && | |
|       sps_ibc_enabled_flag ) | |
|       pred_mode_ibc_flag | ae(v) |
|   } | |
|   if( CuPredMode[ x0 ][ y0 ] = = MODE_INTRA ) { | |
|     if( sps_pcm_enabled_flag && | |
|       cb Width >= MinIpcmCbSizeY && cbWidth <= MaxIpcmCbSizeY && | |
|       cbHeight >= MinIpcmCbSizeY && cbHeight <= MaxIpcmCbSizeY ) | |
|       pcm_flag[ x0 ][ y0 ] | ae(v) |
|     if( pcm_flag[ x0 ][ y0 ] ) { | |
|       while( !byte_aligned( ) ) | |
|         pcm_alignment_zero_bit | f(1) |
|       pcm_sample( cbWidth, cbHeight, treeType) | |
|     } else { | |
|       if( treeType = = SINGLE_TREE \|\| treeType = = DUAL_TREE_LUMA ) { | |
|         if( ( y0 % CtbSizeY ) > 0 ) | |
|           intra_luma_ref_idx[ x0 ][ y0 ] | ae(v) |
|         if (intra_luma_ref_idx[ x0 ][ y0 ] = = 0 && | |
|           ( cbWidth <= MaxTbSizeY \|\| cbHeight <= MaxTbSizeY ) && | |
|           ( cbWidth * cbHeight > MinTbSizeY * MinTbSizeY )) | |
|           intra_subpartitions_mode_flag[ x0 ][ y0 ] | ae(v) |
|         if( intra_subpartitions_mode_flag[ x0 ][ y0 ] = = 1 && | |
|           cbWidth <= MaxTbSizeY && cbHeight <= MaxTbSizeY ) | |
|           intra_subpartitions_split_flag[ x0 ][ y0 ] | ae(v) |
|         if( intra_luma_ref_idx[ x0 ][ y0 ] = = 0 && | |
|           intra_subpartitions_mode_flag[ x0 ][ y0 ] = = 0 ) | |
|           intra_luma_mpm_flag[ x0 ][ y0 ] | ae(v) |
|         if( intra_luma_mpm_flag[ x0 ][ y0 ] ) { | |
|           if( intra_luma_ref_idx[ x0 ][ y0 ] = = 0 ) | |
|             intra_luma_not_planar_flag[ x0 ][ y0 ] | ae(v) |
|           if( intra_luma_not_planar_flag[ x0 ][ y0 ] ) | |
|             intra_luma_mpm_idx[ x0 ][ y0 ] | ae(v) |
|         } else | |
|           intra_luma_mpm_remainder[ x0 ][ y0 ] | ae(v) |
|       } | |
|       if( treeType = = SINGLE_TREE \|\| treeType = = DUAL_TREE_CHROMA ) | |
|         intra_chroma_pred_mode[ x0 ][ y0 ] | ae(v) |
|     } | |
|   } else if( treeType != DUAL_TREE_CHROMA ) { /* MODE_INTER or MODE_IBC */ | |
| ... | |
|   } | |
|   if( !pcm_flag[ x0 ][ y0 ] ) { | |
|     if( CuPredMode[ x0 ][ y0 ] != MODE_INTRA && merge_flag[ x0 ][ y0 ] = = 0 ) | |
|       cu_cbf | ae(v) |
|     if( cu_cbf) { | |
|       if( CuPredMode[ x0 ][ y0 ] = = MODE_INTER && sps_sbt_enabled_flag && | |
|         !ciip_flag[ x0 ][ y0 ] ) { | |
|         if( cbWidth <= MaxSbtSize && cbHeight <= MaxSbtSize ) { | |
|           allowSbtVerH = cbWidth >= 8 | |
|           allowSbtVerQ = cbWidth >= 16 | |
|           allowSbtHorH = cbHeight >= 8 | |
|           allowSbtHorQ = cbHeight >= 16 | |
|           if( allowSbtVerH \|\| allowSbtHorH \|\| allowSbtVerQ \|\| allowSbtHorQ ) | |
|             cu_sbt_flag | ae(v) |
|         } | |
|         if( cu_sbt_flag ) { | |
|           if( ( allowSbtVerH \|\| allowSbtHorH ) && (allowSbtVerQ \|\| allowSbtHorQ) ) | |
|             cu_sbt_quad_flag | ae(v) |
|           if( ( cu_sbt_quad_flag && allowSbtVerQ && allowSbtHorQ ) \|\| | |
|             ( !cu_sbt_quad_flag && allowSbtVerH && allowSbtHorH ) ) | |
|             cu_sbt_horizontal_flag | ae(v) |
|           cu_sbt_pos_flag | ae(v) |
|         } | |
|       } | |
|       transform_tree( x0, y0, cbWidth, cbHeight, treeType ) | |
|     } | |
|   } | |
| } | |

The syntax elements intra_luma_mpm_flag[x0][y0], intra_luma_not_planar_flag[x0][y0], intra_luma_mpm_idx[x0][y0] and intra_luma_mpm_remainder[x0][y0] specify the intra prediction mode for luma samples. The array indices x0, y0 specify the location (x0, y0) of the top-left luma sample of the considered coding block relative to the top-left luma sample of the picture. When intra_luma_mpm_ flag[x0][y0] is equal to 1, the intra prediction mode is inferred from a neighbouring intra-predicted coding unit according to clause 8.4.2.

When intra_luma_mpm_flag[x0][y0] is not present, it is inferred to be equal to 1.

When intra_luma_not_planar_flag[x0][y0] is not present, it is inferred to be equal to 1.

2.10 Chroma Intra Mode Coding

For chroma intra mode coding, a total of 8 intra modes are allowed for chroma intra mode coding. Those modes include five traditional intra modes and three cross-component linear model modes. Chroma direct mode (DM) mode use the corresponding luma intra prediction mode. Since separate block partitioning structure for luma and chroma components is enabled in I slices, one chroma block may correspond to multiple luma blocks. Therefore, for Chroma DM mode, the intra prediction mode of the corresponding luma block covering the center position of the current chroma block is directly inherited.

3. EXAMPLES OF TECHNICAL PROBLEMS SOLVED BY DISCLOSED EMBODIMENTS

Although the QR-BDPCM can achieve coding benefits on screen content coding, it may still have some drawbacks.
1. The prediction in the QR-BDPCM mode is only limited to horizontal and vertical intra predictions, which may limit the prediction efficiency in the QR-BDPCM mode.
2. The intra prediction mode is signaled for QR-BDPCM coded blocks which may increase the rate cost of the QR-BDPCM mode.
3. The neighboring information is not considered when mapping the signaled message to the prediction modes in the QR-BDPCM mode.
4. The QR-BDPCM represents the residue by only supporting horizontal DPCM and vertical DPCM, which may comprise the coding performance on complex residual block.
5. The residual range in the QR-BDPCM may exceed the maximal range of other non QR-BDPCM modes.
6. The QR-BDPCM does not consider the block shape.
7. How to handle chroma when the luma block is coded with QR-BDPCM is unknown.
8. The QR-BDPCM only use the first MPM mode as the stored intra mode, which may limit the coding efficiency of intra modes.

4. EXAMPLE EMBODIMENTS AND TECHNIQUES

The listing of items below should be considered as examples to explain general concepts. These inventions should not be interpreted in a narrow way. Furthermore, these inventions can be combined in any manner.
1. Sample prediction in the QR-BDPCM coded blocks may be generated by the matrix based intra prediction (MIP) method.
   a. In one example, when QR-BDPCM and MIP are both enabled for one block, it is restricted that only partial of allowed modes in MIP are supported.
      i. In one example, the partial of allowed modes may include those modes associated with the matrix based intra prediction method that could be mapped to horizontal and/or vertical normal intra mode.
      ii. In one example, the partial of allowed modes may only include those modes associated with the matrix based intra prediction method that could be mapped to horizontal and/or vertical normal intra mode.
   b. In one example, when QR-BDPCM and MIP are both enabled for one block, all of allowed modes in MIP are supported.
2. Sample prediction in the QR-BDPCM coded blocks may be generated by intra prediction modes other than vertical/horizontal intra predictions.
   a. In one example, the samples in the QR-BDPCM coded blocks may be predicted by an intra prediction mode K
      i. In one example, K may be PLANAR mode
      ii. In one example, K may be DC mode
      iii. In one example, K may be HORIZONTAL mode
      iv. In one example, K may be VERTICAL mode
      v. In one example, K may be one candidate in the list of most probable modes.
      vi. In one example, K may be signaled in the bitstream
   b. The allowed intra prediction modes for QR-BDPCM may be based on
      i. A message signaled in the SPS/video parameter set (VPS)/PPS/picture header/slice header/tile group header/largest coding unit (LCU) row/group of LCUs
      ii. Block dimension of current block and/or its neighboring blocks
      iii. Block shape of current block and/or its neighboring blocks
      iv. Prediction modes (Intra/Inter) of the neighboring blocks of the current block
      v. Intra prediction modes of the neighboring blocks of the current block
      vi. The indication of QR-BDPCM modes of the neighboring block of the current block
      vii. Current quantization parameter of current block and/or that of its neighboring blocks
      viii. Indication of the color format (such as 4:2:0, 4:4:4)
      ix. Separate/dual coding tree structure
      x. Slice/tile group type and/or picture type
3. Sample prediction in the QR-BDPCM coded blocks may be generated by non-adjacent samples.
   a. In one example, for the IBC merge mode, QR-BDPCM may be also enabled.
   b. In one example, for the IBC AMVP mode, QR-BDPCM may be also enabled.
   c. The block vector used in the IBC and QR-BDPCM may be signaled or derived or pre-defined.
      i. In one example, the IBC mode may be indicated by a motion vector (block vector) and/or a merge index.
      ii. In one example, the IBC mode may be indicated by a default motion vector.
         1. In one example, the default motion vector may be (−w,0), where w is a positive integer number 2. In one example, the default motion vector may be (0, −h), where h is a positive integer number
3. In one example, the default motion vector may be (−w, −h), where w and h are two positive integer numbers
   iii. In one example, the indication of a motion vector used in the IBC and QP-BPDCM coded blocks may be based on:
   1. A message signaled in the SPS/VPS/PPS/picture header/slice header/tile group header/LCU row/group of LCUs
   2. Block dimension of current block and/or its neighboring blocks
   3. Block shape of current block and/or its neighboring blocks
   4. Prediction modes (Intra/Inter) of the neighboring blocks of the current block
   5. Motion vectors of the neighboring blocks of the current block
   6. The indication of QR-BDPCM modes of the neighboring block of the current block
   7. Current quantization parameter of current block and/or that of its neighboring blocks
   8. Indication of the color format (such as 4:2:0, 4:4:4)
   9. Separate/dual coding tree structure
   10. Slice/tile group type and/or picture type
   d. In one example, the sample prediction in the QR-BDPCM mode may be generated by Inter prediction tools (e.g. affine mode, merge mode and inter mode)
4. The indication of the quantized residual prediction direction in the QR-BDPCM may be derived on-the-fly.
   a. In one example, the indication of the quantized residual prediction direction in the QR-BDPCM may be inferred based on the indication of current intra prediction mode
      i. In one example, the direction of quantized residual prediction in the QR-BDPCM may be inferred to vertical when the intra prediction mode is vertical
      ii. In one example, the direction of quantized residual prediction in the QR-BDPCM may be inferred to horizontal when the intra prediction mode is horizontal
      iii. In one example, the direction of quantized residual prediction in the QR-BDPCM may be inferred to vertical when the intra prediction mode is horizontal
      iv. In one example, the direction of quantized residual prediction in the QR-BDPCM may be inferred to horizontal when the intra prediction mode is vertical
   b. In one example, the indication of the quantized residual prediction direction in the QR-BDPCM may be based on
      i. A message signaled in the SPS/VPS/PPS/picture header/slice header/tile group header/LCU row/group of LCUs
      ii. Block dimension of current block and/or its neighboring blocks
      iii. Block shape of current block and/or its neighboring blocks
      iv. The most probable modes of the current block and/or its neighboring blocks
      v. Prediction modes (Intra/Inter) of the neighboring blocks of the current block
      vi. Intra prediction modes of the neighboring blocks of the current block
      vii. Motion vectors of the neighboring blocks of the current block
      viii. The indication of QR-BDPCM modes of the neighboring block of the current block
      ix. Current quantization parameter of current block and/or that of its neighboring blocks
      x. Indication of the color format (such as 4:2:0, 4:4:4)
      xi. Separate/dual coding tree structure
      xii. Transform type applied to the current block
      xiii. Slice/tile group type and/or picture type
5. The intra mode of a QR-BDPCM-coded block to be stored may be aligned with the intra prediction mode used in the intra prediction process.
   a. In one example, the intra mode of a QR-BDPCM-coded block to be stored may be inferred to the vertical mode when the QR-BDPCM employs the vertical intra prediction (e.g., bdpcm_dir_flag of the current block is 1).
   b. In one example, the intra mode of a QR-BDPCM-coded block to be stored may be inferred to the horizontal mode when the QR-BDPCM employs the horizontal intra prediction (e.g., bdpcm_dir_flag of the current block is 0).
   c. In one example, the intra mode of a QR-BDPCM-coded block to be stored may be inferred to the top-left mode (e.g., Mode 34 in VVC) when the QR-BDPCM employs the top-left intra prediction direction.
   d. In one example, the intra mode of a QR-BDPCM-coded block to be stored may be inferred to the mode when is employed in the intra prediction process in the QR-BDPCM mode.
   e. In one example, the intra mode of a QR-BDPCM-coded block to be stored may be inferred to the mode when is employed in the residual prediction process in the QR-BDPCM mode.
   f. In one example, the intra mode of the blocks coded in the QR-BDPCM may be inferred to one mode in Most Probable Modes (MPM) list.
   g. In one example, the intra mode of the blocks coded in the QR-BDPCM may inferred to a pre-defined mode.
      i. In one example, the pre-defined mode may be
         1. Planar mode
         2. DC mode
         3. Vertical mode
         4. Horizontal mode
   h. In one example, the intra mode of a block coded in the QR-BDPCM mode may be determined based on
      i. Color component
      ii. A message signaled in the SPS/VPS/PPS/picture header/slice header/tile group header/LCU row/group of LCUs
      iii. bdpcm_dir_flag
      iv. bdpcm_flag
      ii. Block dimension of current block and/or its neighboring blocks
      iii. Block shape of current block and/or its neighboring blocks
      iv. The most probable modes of the current block and/or its neighboring blocks
      v. Prediction modes (Intra/Inter) of the neighboring blocks of the current block
      vi. Intra prediction modes of the neighboring blocks of the current block vii. Motion vectors of the neighboring blocks of the current block
viii. The indication of QR-BDPCM modes of the neighboring block of the current block
ix. Current quantization parameter of current block and/or that of its neighboring blocks
x. Indication of the color format (such as 4:2:0, 4:4:4)
xi. Coding tree structure
xii. Transform type applied to the current block
xiii. Slice/tile group type and/or picture type
i. In one example, the stored intra prediction mode may be utilized for coding the following blocks, such as for the MPM list construction of the following blocks to be coded.

6. The mapping from a signaled index in the QR-BDPCM to the intra prediction mode in the QR-BDPCM mode may be based on
   a. A message signaled in the SPS/VPS/PPS/picture header/slice header/tile group header/LCU row/group of LCUs
   b. Block dimension of current block and/or its neighboring blocks
   c. Block shape of current block and/or its neighboring blocks
   d. The most probable modes of the current block and/or its neighboring blocks
   e. Prediction modes (Intra/Inter) of the neighboring blocks of the current block
   f. Intra prediction modes of the neighboring blocks of the current block
   g. Motion vectors of the neighboring blocks of the current block
   h. The indication of QR-BDPCM modes of the neighboring block of the current block
   i. Current quantization parameter of current block and/or that of its neighboring blocks
   j. Indication of the color format (such as 4:2:0, 4:4:4)
   k. Separate/dual coding tree structure
   l. Transform type applied to the current block
   m. Slice/tile group type and/or picture type 7. In QR-BDPCM, the quantized residue are predicted along the horizontal and vertical directions. It is proposed to predict the quantized residue along the directions other than vertical and horizontal directions. Suppose $Q(r_{i,j})$ denotes the quantized residue $\tilde{r}_{i,j}$ denotes the quantized residue after the residue prediction process.
   a. In one example, the 45-degree QR-BDPCM may be supported.
      i. In one example, the DPCM may be performed along the 45-degree direction, where the $\tilde{r}_{i,j}$ may be derived by $Q(r_{i,j})-Q(r_{(i-1),(j-1)})$ if the $Q(r_{(i-1),(j-1)})$ is available.
   b. In one example, the 135-degree QR-BDPCM may be supported.
      i. In one example, the DPCM may be performed along the 45-degree direction, where the $\tilde{r}_{i,j}$ may be derived by $Q(r_{i,j})-Q(r_{(i-1),(j-1)})$ if the $Q(r_{(i-1),(j-1)})$ is available
   c. In one example, any directions may be supported in QR-BDPCM.
      i. In one example, the $\tilde{r}_{i,j}$ may be derived by $Q(r_{i,j})-Q(r_{(i-m),(j-n)})$ if the $Q(r_{(i-m),(j-n)})$ is available.
         1. In one example, m and/or n may be signaled in the bitstream
         2. In one example, m and/or n may be integer numbers and may be based on
         3. A message signaled in the SPS/VPS/PPS/picture header/slice header/tile group header/LCU row/group of LCUs
         4. i and/or j
         5. Block dimension of current block and/or its neighboring blocks
         6. Block shape of current block and/or its neighboring blocks
         7. The most probable modes of the current block and/or its neighboring blocks
         8. Prediction modes (Intra/Inter) of the neighboring blocks of the current block
         9. Intra prediction modes of the neighboring blocks of the current block
         10. Motion vectors of the neighboring blocks of the current block
         11. The indication of QR-BDPCM modes of the neighboring block of the current block
         12. Current quantization parameter of current block and/or that of its neighboring blocks
         13. Indication of the color format (such as 4:2:0, 4:4:4)
         14. Separate/dual coding tree structure
         15. Slice/tile group type and/or picture type 8. QR-BDPCM may be applied to chroma blocks (e.g., blue chroma component (Cb)/red chroma component (Cr), or blue (B)/red (R) color components).
   a. In one example, the allowed intra prediction directions for luma and chroma QR-BDPCM coded blocks may be the same, e.g., only horizontal and vertical.
   b. In one example, the allowed prediction methods for luma and chroma QR-BDPCM coded blocks may be the same, e.g., IBC/Inter/horizontal and vertical intra prediction modes.
   c. In one example, the allowed residual prediction direction for luma and chroma QR-BDPCM coded blocks may be the same.
   d. In one example, the residual prediction direction for chroma QR-BDPCM may be derived from the residual prediction direction for corresponding luma block.
      i. In one example, the corresponding luma block may be the collocated luma block.
      ii. In one example, the corresponding luma block may be the luma block containing the collocated sample of the upper-left corner of the chroma block.
      iii. In one example, the corresponding luma block may be the luma block containing the collocated sample of the centered sample of the chroma block.
   e. In one example, cross-component linear model (CCLM) and QR-BDPCM couldn't be applied to the same chroma block.
      i. Alternatively, CCLM may be also applicable to QR-BDPCM coded blocks.
   f. In one example, joint chroma residual coding (e.g., joint cb and cr coding) method and QR-BDPCM couldn't be applied to the same chroma block.

9. The reconstrued quantized residue in QR-BDPCM may be restricted to be within a specific range.
   a. In one example, a constraint may be added that all the quantized residual differences (e.g., $\tilde{r}_{i,j}$ in equation 2-7-1 and 2-7-2) may be within a specific range.

b. In one example, a constraint may be added that all the reconstrued quantized residual (e.g., $Q(r_{i,j})$ in equation 2-7-3 and 2-7-4) may be within a specific range.
c. In one example, clipping operation may be applied to the quantized residual differences (e.g., $\tilde{r}_{i,j}$ in equation 2-7-1 and 2-7-2) so that the reconstrued quantized residual may be within a specific range.
d. In one example, clipping operation may be applied to the reconstrued quantized residual differences (e.g., $Q(r_{i,j})$ in equation 2-7-3 and 2-7-4) so that the reconstrued quantized residual may be within a specific range.
e. In one example, the clipping operation may be defined as (x<min? min: (x>max? max: x))
f. In one example, the clipping operation may be defined as (x<=min? min: (x>=max? max: x))
g. In one example, the clipping operation may be defined as (x<min? min: (x>=max? max: x))
h. In one example, the clipping operation may be defined as (x<=min? min: (x>max? max: x))
i. In one example, the min and/or max may be negative or positive
j. In one example, min is set to −32768 and max is set to 32767.
  i. Alternatively, the min and/or max may depend on the range of inverse quantization for blocks coded not with QR-BDPCM.
  ii. Alternatively, the min and/or max may depend on the bit depth of input sample/reconstructed sample.
  iii. Alternatively, the min and/or max may depend on whether lossless coding is used.
    1. In one example, the min and/or max may depend on transquant_bypass_enabled_flag.
    2. In one example, the min and/or max may depend on cu_transquant_bypass_flag.
k. In one example, the min and/or max may be based on
  i. A message signaled in the SPS/VPS/PPS/picture header/slice header/tile group header/LCU row/group of LCUs
  ii. Block dimension of current block and/or its neighboring blocks
  iii. Block shape of current block and/or its neighboring blocks
  iv. The most probable modes of the current block and/or its neighboring blocks
  v. Prediction modes (Intra/Inter) of the neighboring blocks of the current block
  vi. Intra prediction modes of the neighboring blocks of the current block
  vii. Motion vectors of the neighboring blocks of the current block
  viii. The indication of QR-BDPCM modes of the neighboring block of the current block
  ix. Current quantization parameter of current block and/or that of its neighboring blocks
  x. Indication of the color format (such as 4:2:0, 4:4:4)
  xi. Separate/dual coding tree structure
  xii. Transform type applied to the current block
  xiii. Slice/tile group type and/or picture type
10. QR-DPCM may be applied from the last row/column to the first row/column for a block.
  a. In one example, when the residual prediction direction is horizontal, the (i+1)-th column's residual may be used to predict the i-th column's residual.
  b. In one example, when the residual prediction direction is vertical, the (i+1)-th row's residual may be used to predict the i-th row's residual.
11. QR-DPCM may be applied to a subset of a block.
  a. In one example, when the residual prediction direction is horizontal, QR-DPCM does not apply to the left most k columns of residues.
  b. In one example, when the residual prediction direction is vertical, QR-DPCM does not apply to the upper most k rows of residues.
  c. In one example, when the residual prediction direction is horizontal, QR-DPCM does not apply to the right most k columns of residues.
  d. In one example, when the residual prediction direction is vertical, QR-DPCM does not apply to the bottom most k rows of residues.
  e. The value of k described above may be a predefined value, based on.
    i. A message signaled in the SPS/VPS/PPS/picture header/slice header/tile group header/LCU row/group of LCUs
    ii. Block dimension of current block and/or its neighboring blocks
    iii. Block shape of current block and/or its neighboring blocks
    iv. The most probable modes of the current block and/or its neighboring blocks
    v. Prediction modes (Intra/Inter) of the neighboring blocks of the current block
    vi. Intra prediction modes of the current block
    vii. Intra prediction modes of the neighboring blocks of the current block
    viii. Motion vectors of the neighboring blocks of the current block
    ix. The indication of QR-BDPCM modes of the neighboring block of the current block
    x. Current quantization parameter of current block and/or that of its neighboring blocks
    xi. Indication of the color format (such as 4:2:0, 4:4:4)
    xii. Separate/dual coding tree structure
    xiii. Transform type applied to the current block
    xiv. Slice/tile group type and/or picture type
12. QR-DPCM may be applied segment by segment for a block
  a. In one example, when the residual prediction direction is vertical and N=nK, residual prediction may be performed as:

$$\tilde{r}_{i,j} = \begin{cases} Q(r_{i,j}), & i \% K = 0, 0 \le j \le (N-1) \\ Q(r_{i,j}) - Q(r_{(i-1),j}), & i \% K > 0, i \le (M-1), 0 \le j \le (N-1) \end{cases}.$$

b. In one example, when the residual prediction direction is horizontal and M=mK, residual prediction may be performed as:

$$\tilde{r}_{i,j} = \begin{cases} Q(r_{i,j}), & 0 \le i \le (M-1), j \% K = 0 \\ Q(r_{i,j}) - Q(r_{i,(j-1)}), & 0 \le i \le (M-1), j \% K > 0, j \le (N-1) \end{cases}.$$

13. Enabling/disabling QR-DPCM for one color component may be derived from that associated with another color component.
  a. In one example, for a chroma block, whether to enable QR-DPCM may be dependent on the usage of QR-DPCM associated with one or multiple representative blocks within the collocated luma block.
  i. In one example, the representative block may be defined in the same way as that used for DM derivation.
  ii. In one example, if the representative block within the collocated luma block is QR-DPCM coded, and the current chroma block is coded with DM mode, QR-DPCM may be also enabled for the current chroma block.
b. Alternatively, indication of usage of QR-DPCM may be signaled for chroma components.
  i. In one example, one flag may be signaled to indicate the usage for two chroma components.
  ii. Alternatively, two flags may be signaled to indicate the usage for two chroma components, respectively.
  iii. In one example, when the chroma block is coded with certain modes (such as CCLM), the signaling of indication of usage of QR-DPCM is skipped.
14. The above methods may be also applicable to other variances of DPCM/QR-DPCM.

5. EMBODIMENT

The changes on top of the draft provided by JVET-N0413 are highlighted in bold face italics. Deleted texts are marked with strikethrough.

5.1 Embodiment 1 i. Derivation Process for Luma Intra Prediction Mode
Input to this process are:
  a luma location (xCb, yCb) specifying the top-left sample of the current luma coding block relative to the top-left luma sample of the current picture,
  a variable cbWidth specifying the width of the current coding block in luma samples,
  a variable cbHeight specifying the height of the current coding block in luma samples.
In this process, the luma intra prediction mode IntraPredModeY[xCb][yCb] is derived.
Table 8-1 specifies the value for the intra prediction mode IntraPredModeY[xCb][yCb] and the associated names.

TABLE 8-1

Specification of intra prediction mode and associated names

| Intra prediction mode | Associated name |
|---|---|
| 0 | INTRA_PLANAR |
| 1 | INTRA_DC |
| 2 . . . 66 | INTRA_ANGULAR2 . . . INTRA_ANGULAR66 |
| 81 . . . 83 | INTRA_LT_CCLM, INTRA_L_CCLM, INTRA_T_CCLM |

NOTE:
The intra prediction modes INTRA_LT_CCLM, INTRA_L_CCLM and INTRA_T_CCLM are only applicable to chroma components.

IntraPredModeY[xCb][yCb] is derived by the following ordered steps:
  The neighbouring locations (xNbA, yNbA) and (xNbB, yNbB) are set equal to (xCb−1, yCb+cbHeight−1) and (xCb+cbWidth−1, yCb−1), respectively.
  For X being replaced by either A or B, the variables candIntraPredModeX are derived as follows:
  . . .

The variables ispDefaultMode1 and ispDefaultMode2 are defined as follows:
  . . .
The candModeList[x] with x=0 . . . 5 is derived as follows:
  . . .
IntraPredModeY[xCb][yCb] is derived by applying the following procedure:
  *If bdpcm_flag[ xCb ][ yCb ] is equal to 1, the IntraPredModeY[*
  *xCb ][ yCb ] is set equal to*
  *(bdpcm_dir_flag[ xCb ][ yCb ] == 0?*
  *INTRA_ANGULAR18 : INTRA_ANGULAR50).*
  Otherwise if intra_luma_mpm_flag[xCb][yCb] is equal to 1, the IntraPredModeY[xCb][yCb] is set equal to candModeList[intra_luma_mpm_idx[xCb][yCb]].
  Otherwise, IntraPredModeY[xCb][yCb] is derived by applying the following ordered steps:
  . . .
The variable IntraPredModeY[x][y] with x=xCb . . . xCb+cbWidth−1 and y=yCb . . . yCb+cbHeight−1 is set to be equal to IntraPredModeY[xCb][yCb].

5.2 Embodiment 2

8.4.2 Derivation Process for Luma Intra Prediction Mode

Input to this process are:
  a luma location (xCb, yCb) specifying the top-left sample of the current luma coding block relative to the top-left luma sample of the current picture,
  a variable cbWidth specifying the width of the current coding block in luma samples,
  a variable cbHeight specifying the height of the current coding block in luma samples.
In this process, the luma intra prediction mode IntraPredModeY[xCb][yCb] is derived.
Table 8-1 specifies the value for the intra prediction mode IntraPredModeY[xCb][yCb] and the associated names.

TABLE 8-1

Specification of intra prediction mode and associated names

| Intra prediction mode | Associated name |
|---|---|
| 0 | INTRA_PLANAR |
| 1 | INTRA_DC |
| 2 . . . 66 | INTRA_ANGULAR2 . . . INTRA_ANGULAR66 |
| 81 . . . 83 | INTRA_LT_CCLM, INTRA_L_CCLM, INTRA_T_CCLM |

NOTE:
The intra prediction modes INTRA_LT_CCLM, INTRA_L_CCLM and INTRA_T_CCLM are only applicable to chroma components.

IntraPredModeY[xCb][yCb] is derived by the following ordered steps:
  *If bdpcm_flag[ xCb ][ yCb ]*
  *is equal to 1, the IntraPredModeY[*
  *xCb ][ yCb ] is set equal to*
  *(bdpcm_dir_flag[ xCb ][ yCb ]*
  *== 0? INTRA_ANGULAR18: INTRA_ANGULAR50).*
  *Otherwise, IntraPredModeY[*
  *xCb ][ yCb ] is derived by applying*
  *the following ordered steps:*

The neighbouring locations (xNbA, yNbA) and (xNbB, yNbB) are set equal to (xCb−1, yCb+cbHeight−1) and (xCb+cbWidth−1, yCb−1), respectively.

For X being replaced by either A or B, the variables candIntraPredModeX are derived as follows:
. . .

The variables ispDefaultMode1 and ispDefaultMode2 are defined as follows:
. . .

The candModeList[x] with x=0 . . . 5 is derived as follows:
. . .

IntraPredModeY[xCb][yCb] is derived by applying the following procedure:
 if intra_luma_mpm_flag[xCb][yCb] is equal to 1, the IntraPredModeY[xCb][yCb] is set equal to candModeList[intra_luma_mpm_idx[xCb][yCb]].
 Otherwise, IntraPredModeY[xCb][yCb] is derived by applying the following ordered steps:
. . .

The variable IntraPredModeY[x][y] with x=xCb . . . xCb+cbWidth−1 and y=yCb . . . yCb+cbHeight−1 is set to be equal to IntraPredModeY[xCb][yCb].

6. REFERENCE

[1] ITU-T and ISO/IEC, "High efficiency video coding", Rec. ITU-T H.265|ISO/IEC 23008-2 (02/2018).
[2] B. Bross, J. Chen, S. Liu, Versatile Video Coding (Draft 4), JVET-M1001, January 2019

Figure 10:
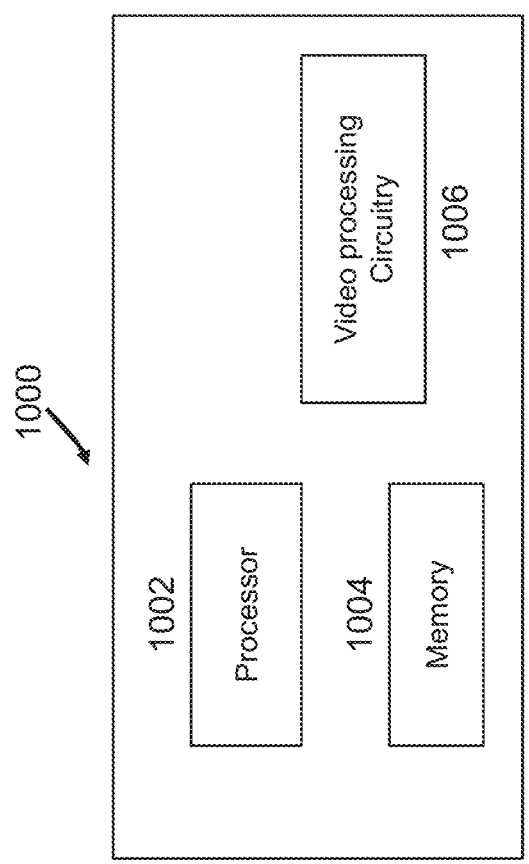
FIG. 10 is a block diagram of an example hardware platform for implementing techniques described in the present document.

FIG. 10 is a block diagram of a video processing apparatus 1000. The apparatus 1000 may be used to implement one or more of the methods described herein. The apparatus 1000 may be embodied in a smartphone, tablet, computer, Internet of Things (IoT) receiver, and so on. The apparatus 1000 may include one or more processors 1002, one or more memories 1004 and video processing hardware 1006. The processor(s) 1002 may be configured to implement one or more methods described in the present document. The memory (memories) 1004 may be used for storing data and code used for implementing the methods and techniques described herein. The video processing hardware 1006 may be used to implement, in hardware circuitry, some techniques described in the present document.

Figure 11:
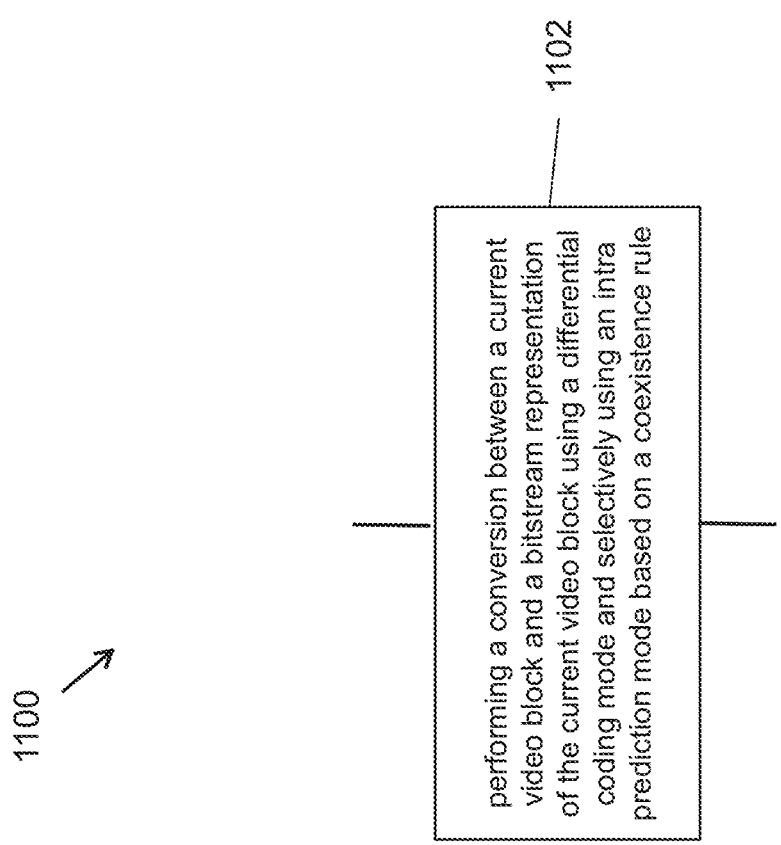
FIG. 11 is a flowchart for an example method of video processing.

FIG. 11 is a flowchart for an example method 1100 of video processing. The method 1100 includes performing (1102) a conversion between a current video block and a bitstream representation of the current video block using a differential coding mode and selectively using an intra prediction mode based on a coexistence rule. The intra prediction mode is used for generating predictions for samples of the current video block. The differential coding mode is used to represent a quantized residual block from the predictions of the pixels, using a differential pulse coding modulation representation.

Figure 15:
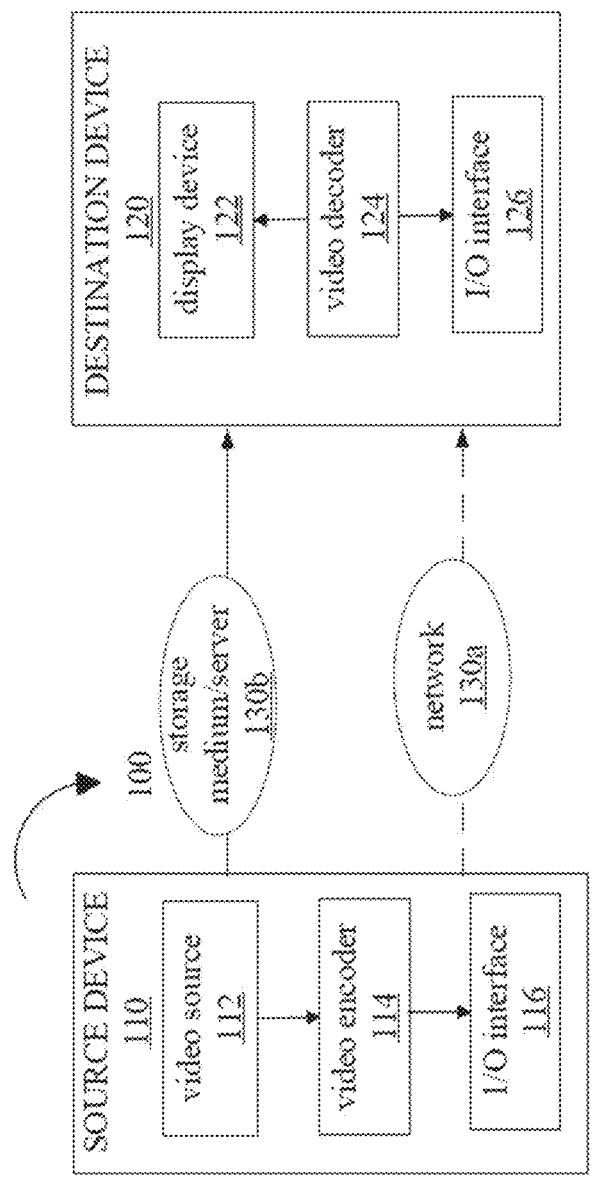
FIG. 15 is a block diagram that illustrates an example video coding system that may utilize the techniques of this disclosure.

FIG. 15 is a block diagram that illustrates an example video coding system 100 that may utilize the techniques of this disclosure. As shown in FIG. 15, video coding system 100 may include a source device 110 and a destination device 120. Source device 110 generates encoded video data which may be referred to as a video encoding device. Destination device 120 may decode the encoded video data generated by source device 110 which may be referred to as a video decoding device. Source device 110 may include a video source 112, a video encoder 114, and an input/output (I/O) interface 116.

Video source 112 may include a source such as a video capture device, an interface to receive video data from a video content provider, and/or a computer graphics system for generating video data, or a combination of such sources. The video data may comprise one or more pictures. Video encoder 114 encodes the video data from video source 112 to generate a bitstream. The bitstream may include a sequence of bits that form a coded representation of the video data. The bitstream may include coded pictures and associated data. The coded picture is a coded representation of a picture. The associated data may include sequence parameter sets, picture parameter sets, and other syntax structures. I/O interface 116 may include a modulator/demodulator (modem) and/or a transmitter. The encoded video data may be transmitted directly to destination device 120 via I/O interface 116 through network 130a. The encoded video data may also be stored onto a storage medium/server 130b for access by destination device 120.

Destination device 120 may include an I/O interface 126, a video decoder 124, and a display device 122.

I/O interface 126 may include a receiver and/or a modem. I/O interface 126 may acquire encoded video data from the source device 110 or the storage medium/server 130b. Video decoder 124 may decode the encoded video data. Display device 122 may display the decoded video data to a user. Display device 122 may be integrated with the destination device 120, or may be external to destination device 120 which be configured to interface with an external display device.

Video encoder 114 and video decoder 124 may operate according to a video compression standard, such as the High Efficiency Video Coding (HEVC) standard, Versatile Video Coding (VVC) standard and other current and/or further standards.

Figure 16:
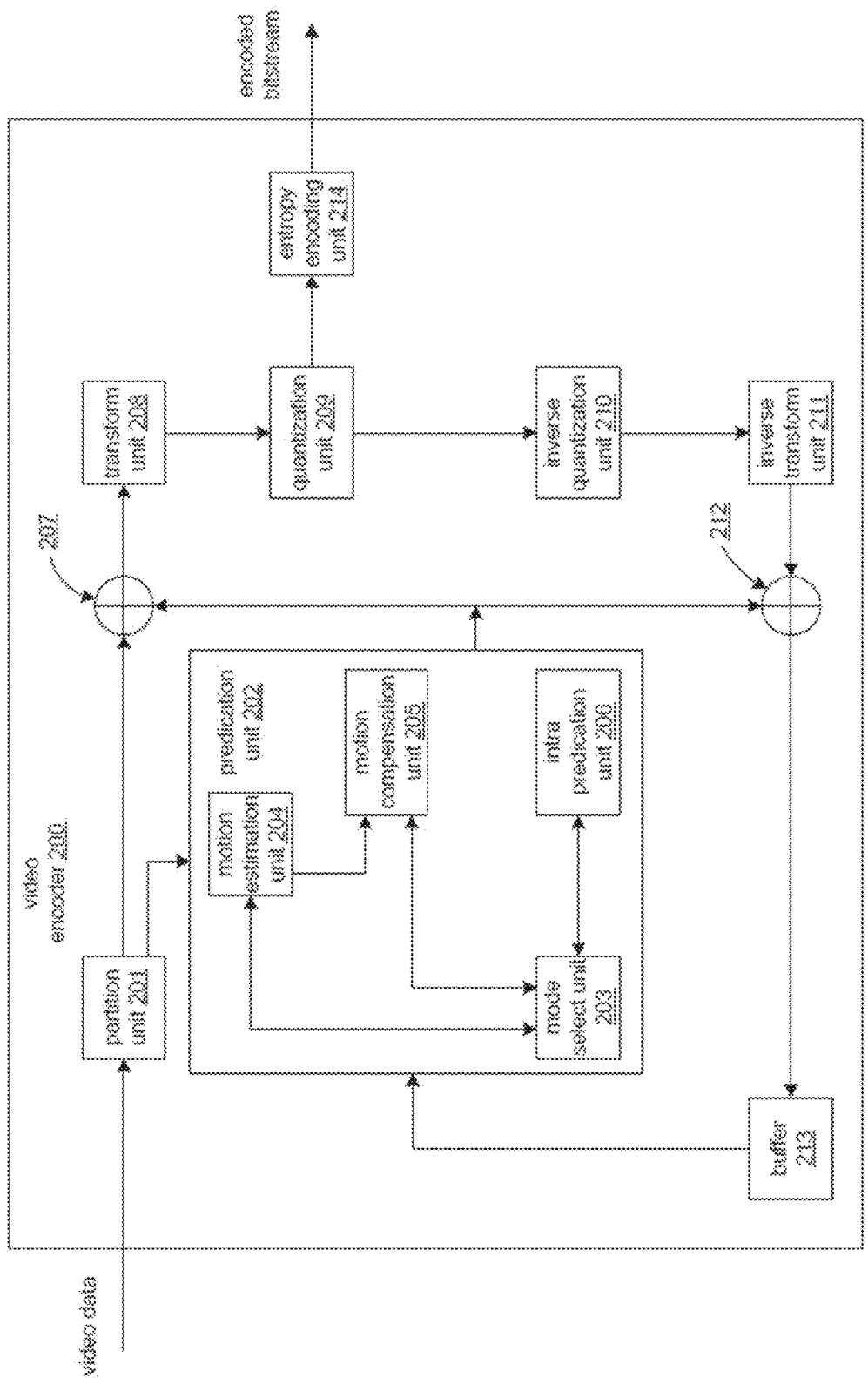
FIG. 16 is a block diagram illustrating an example of video encoder.

FIG. 16 is a block diagram illustrating an example of video encoder 200, which may be video encoder 114 in the system 100 illustrated in FIG. 15.

Video encoder 200 may be configured to perform any or all of the techniques of this disclosure. In the example of FIG. 16, video encoder 200 includes a plurality of functional components. The techniques described in this disclosure may be shared among the various components of video encoder 200. In some examples, a processor may be configured to perform any or all of the techniques described in this disclosure.

The functional components of video encoder 200 may include a partition unit 201, a predication unit 202 which may include a mode select unit 203, a motion estimation unit 204, a motion compensation unit 205 and an intra prediction unit 206, a residual generation unit 207, a transform unit 208, a quantization unit 209, an inverse quantization unit 210, an inverse transform unit 211, a reconstruction unit 212, a buffer 213, and an entropy encoding unit 214.

In other examples, video encoder 200 may include more, fewer, or different functional components. In an example, predication unit 202 may include an intra block copy (IBC) unit. The IBC unit may perform predication in an IBC mode in which at least one reference picture is a picture where the current video block is located.

Furthermore, some components, such as motion estimation unit 204 and motion compensation unit 205 may be highly integrated, but are represented in the example of FIG. 16 separately for purposes of explanation.

Partition unit 201 may partition a picture into one or more video blocks. Video encoder 200 and video decoder 300 may support various video block sizes.

Mode select unit 203 may select one of the coding modes, intra or inter, e.g., based on error results, and provide the resulting intra- or inter-coded block to a residual generation unit 207 to generate residual block data and to a reconstruction unit 212 to reconstruct the encoded block for use as a reference picture. In some example, Mode select unit 203 may select a combination of intra and inter predication (CIIP) mode in which the predication is based on an inter predication signal and an intra predication signal. Mode select unit 203 may also select a resolution for a motion vector (e.g., a sub-pixel or integer pixel precision) for the block in the case of inter-predication.

To perform inter prediction on a current video block, motion estimation unit 204 may generate motion information for the current video block by comparing one or more reference frames from buffer 213 to the current video block. Motion compensation unit 205 may determine a predicted video block for the current video block based on the motion information and decoded samples of pictures from buffer 213 other than the picture associated with the current video block.

Motion estimation unit 204 and motion compensation unit 205 may perform different operations for a current video block, for example, depending on whether the current video block is in an I slice, a P slice, or a B slice.

In some examples, motion estimation unit 204 may perform uni-directional prediction for the current video block, and motion estimation unit 204 may search reference pictures of list 0 or list 1 for a reference video block for the current video block. Motion estimation unit 204 may then generate a reference index that indicates the reference picture in list 0 or list 1 that contains the reference video block and a motion vector that indicates a spatial displacement between the current video block and the reference video block. Motion estimation unit 204 may output the reference index, a prediction direction indicator, and the motion vector as the motion information of the current video block. Motion compensation unit 205 may generate the predicted video block of the current block based on the reference video block indicated by the motion information of the current video block.

In other examples, motion estimation unit 204 may perform bi-directional prediction for the current video block, motion estimation unit 204 may search the reference pictures in list 0 for a reference video block for the current video block and may also search the reference pictures in list 1 for another reference video block for the current video block. Motion estimation unit 204 may then generate reference indexes that indicate the reference pictures in list 0 and list 1 containing the reference video blocks and motion vectors that indicate spatial displacements between the reference video blocks and the current video block. Motion estimation unit 204 may output the reference indexes and the motion vectors of the current video block as the motion information of the current video block. Motion compensation unit 205 may generate the predicted video block of the current video block based on the reference video blocks indicated by the motion information of the current video block.

In some examples, motion estimation unit 204 may output a full set of motion information for decoding processing of a decoder.

In some examples, motion estimation unit 204 may do not output a full set of motion information for the current video. Rather, motion estimation unit 204 may signal the motion information of the current video block with reference to the motion information of another video block. For example, motion estimation unit 204 may determine that the motion information of the current video block is sufficiently similar to the motion information of a neighboring video block.

In one example, motion estimation unit 204 may indicate, in a syntax structure associated with the current video block, a value that indicates to the video decoder 300 that the current video block has the same motion information as the another video block.

In another example, motion estimation unit 204 may identify, in a syntax structure associated with the current video block, another video block and a motion vector difference (MVD). The motion vector difference indicates a difference between the motion vector of the current video block and the motion vector of the indicated video block. The video decoder 300 may use the motion vector of the indicated video block and the motion vector difference to determine the motion vector of the current video block.

As discussed above, video encoder 200 may predictively signal the motion vector. Two examples of predictive signaling techniques that may be implemented by video encoder 200 include advanced motion vector predication (AMVP) and merge mode signaling.

Intra prediction unit 206 may perform intra prediction on the current video block. When intra prediction unit 206 performs intra prediction on the current video block, intra prediction unit 206 may generate prediction data for the current video block based on decoded samples of other video blocks in the same picture. The prediction data for the current video block may include a predicted video block and various syntax elements.

Residual generation unit 207 may generate residual data for the current video block by subtracting (e.g., indicated by the minus sign) the predicted video block(s) of the current video block from the current video block. The residual data of the current video block may include residual video blocks that correspond to different sample components of the samples in the current video block.

In other examples, there may be no residual data for the current video block for the current video block, for example in a skip mode, and residual generation unit 207 may not perform the subtracting operation.

Transform processing unit 208 may generate one or more transform coefficient video blocks for the current video block by applying one or more transforms to a residual video block associated with the current video block.

After transform processing unit 208 generates a transform coefficient video block associated with the current video block, quantization unit 209 may quantize the transform coefficient video block associated with the current video block based on one or more quantization parameter (QP) values associated with the current video block.

Inverse quantization unit 210 and inverse transform unit 211 may apply inverse quantization and inverse transforms to the transform coefficient video block, respectively, to reconstruct a residual video block from the transform coefficient video block. Reconstruction unit 212 may add the reconstructed residual video block to corresponding samples from one or more predicted video blocks generated by the predication unit 202 to produce a reconstructed video block associated with the current block for storage in the buffer 213.

After reconstruction unit 212 reconstructs the video block, loop filtering operation may be performed reduce video blocking artifacts in the video block.

Entropy encoding unit 214 may receive data from other functional components of the video encoder 200. When entropy encoding unit 214 receives the data, entropy encoding unit 214 may perform one or more entropy encoding operations to generate entropy encoded data and output a bitstream that includes the entropy encoded data.

Figure 17:
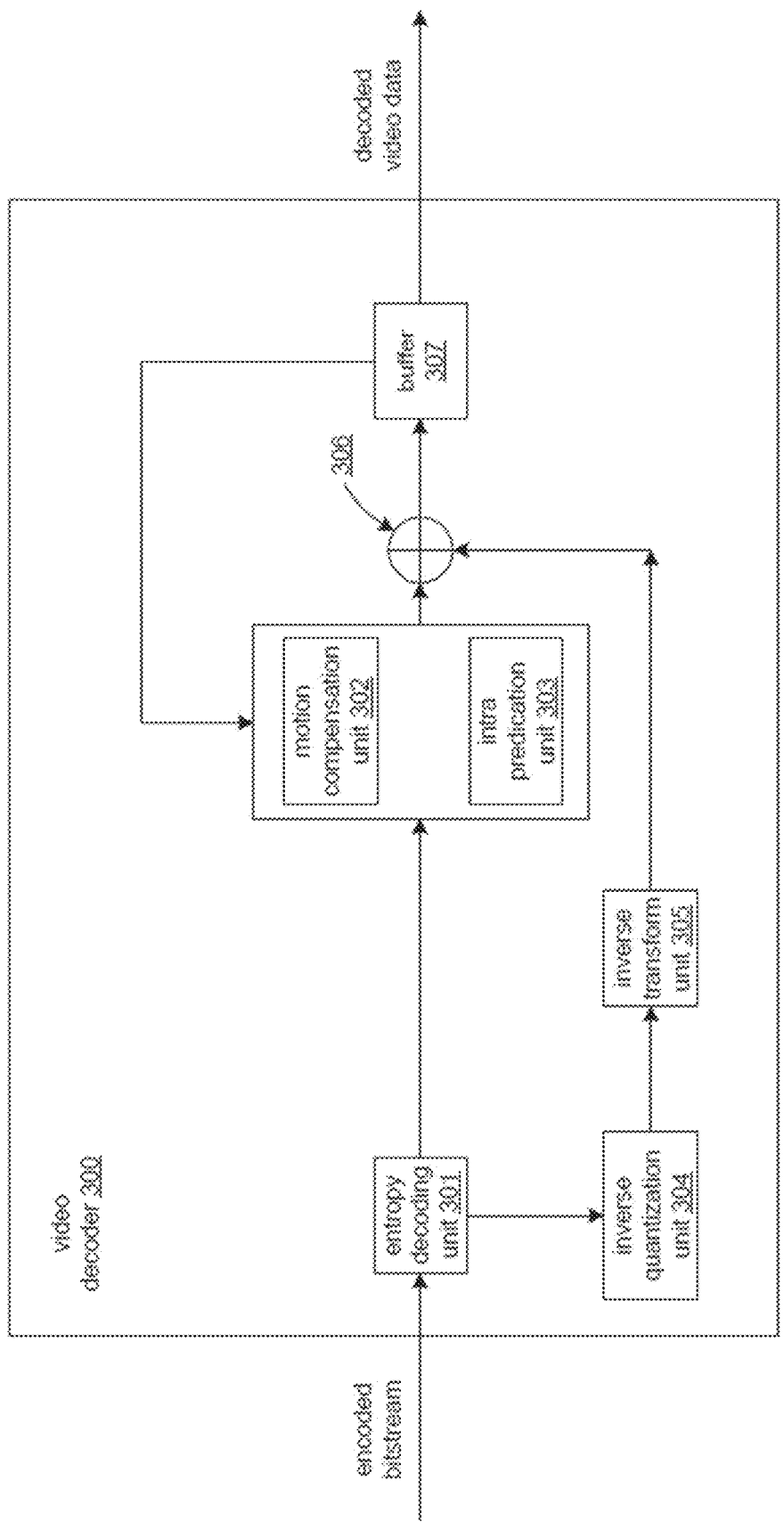
FIG. 17 is a block diagram illustrating an example of video decoder.

FIG. 17 is a block diagram illustrating an example of video decoder 300 which may be video decoder 114 in the system 100 illustrated in FIG. 15.

The video decoder 300 may be configured to perform any or all of the techniques of this disclosure. In the example of FIG. 17, the video decoder 300 includes a plurality of functional components. The techniques described in this disclosure may be shared among the various components of the video decoder 300. In some examples, a processor may be configured to perform any or all of the techniques described in this disclosure.

In the example of FIG. 17, video decoder 300 includes an entropy decoding unit 301, a motion compensation unit 302, an intra prediction unit 303, an inverse quantization unit 304, an inverse transformation unit 305, and a reconstruction unit 306 and a buffer 307. Video decoder 300 may, in some examples, perform a decoding pass generally reciprocal to the encoding pass described with respect to video encoder 200 (FIG. 16).

Entropy decoding unit 301 may retrieve an encoded bitstream. The encoded bitstream may include entropy coded video data (e.g., encoded blocks of video data). Entropy decoding unit 301 may decode the entropy coded video data, and from the entropy decoded video data, motion compensation unit 302 may determine motion information including motion vectors, motion vector precision, reference picture list indexes, and other motion information. Motion compensation unit 302 may, for example, determine such information by performing the AMVP and merge mode.

Motion compensation unit 302 may produce motion compensated blocks, possibly performing interpolation based on interpolation filters. Identifiers for interpolation filters to be used with sub-pixel precision may be included in the syntax elements.

Motion compensation unit 302 may use interpolation filters as used by video encoder 20 during encoding of the video block to calculate interpolated values for sub-integer pixels of a reference block. Motion compensation unit 302 may determine the interpolation filters used by video encoder 200 according to received syntax information and use the interpolation filters to produce predictive blocks.

Motion compensation unit 302 may uses some of the syntax information to determine sizes of blocks used to encode frame(s) and/or slice(s) of the encoded video sequence, partition information that describes how each macroblock of a picture of the encoded video sequence is partitioned, modes indicating how each partition is encoded, one or more reference frames (and reference frame lists) for each inter-encoded block, and other information to decode the encoded video sequence.

Intra prediction unit 303 may use intra prediction modes for example received in the bitstream to form a prediction block from spatially adjacent blocks. Inverse quantization unit 303 inverse quantizes, i.e., de-quantizes, the quantized video block coefficients provided in the bitstream and decoded by entropy decoding unit 301. Inverse transform unit 303 applies an inverse transform.

Reconstruction unit 306 may sum the residual blocks with the corresponding prediction blocks generated by motion compensation unit 202 or intra-prediction unit 303 to form decoded blocks. If desired, a deblocking filter may also be applied to filter the decoded blocks in order to remove blockiness artifacts. The decoded video blocks are then stored in buffer 307, which provides reference blocks for subsequent motion compensation/intra predication and also produces decoded video for presentation on a display device.

In some embodiments, in the ALWIP mode or MIP mode, a prediction block for the current video block is determined by a row and column wise averaging, followed by a matrix multiplication, followed by an interpolation to determine the prediction block.

Figure 18:
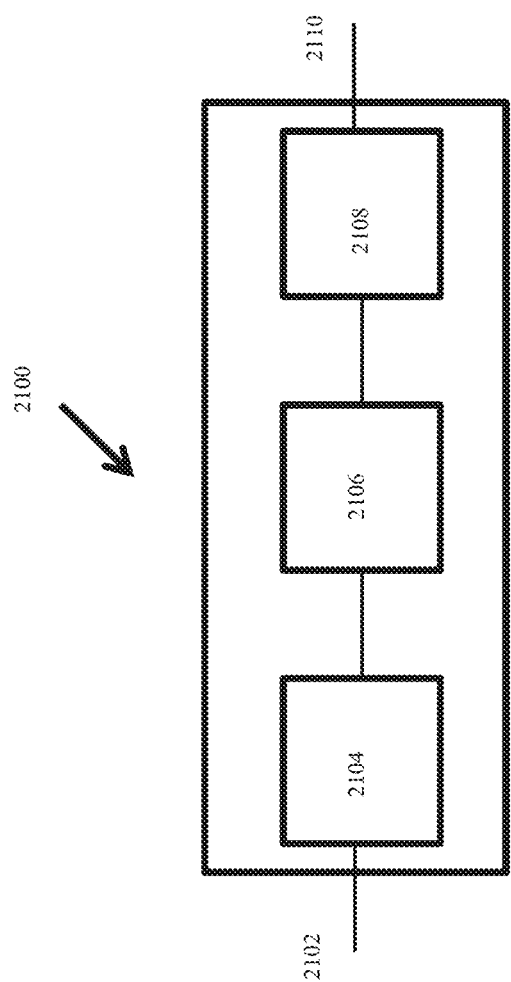
FIG. 18 is a block diagram showing an example video processing system in which various techniques disclosed herein may be implemented.

FIG. 18 is a block diagram showing an example video processing system 2100 in which various techniques disclosed herein may be implemented. Various implementations may include some or all of the components of the system 2100. The system 2100 may include input 2102 for receiving video content. The video content may be received in a raw or uncompressed format, e.g., 8 or 10 bit multi-component pixel values, or may be in a compressed or encoded format. The input 2102 may represent a network interface, a peripheral bus interface, or a storage interface. Examples of network interface include wired interfaces such as Ethernet, passive optical network (PON), etc. and wireless interfaces such as wireless fidelity (Wi-Fi) or cellular interfaces.

The system 2100 may include a coding component 2104 that may implement the various coding or encoding methods described in the present document. The coding component 2104 may reduce the average bitrate of video from the input 2102 to the output of the coding component 2104 to produce a coded representation of the video. The coding techniques are therefore sometimes called video compression or video transcoding techniques. The output of the coding component 2104 may be either stored, or transmitted via a communication connected, as represented by the component 2106. The stored or communicated bitstream (or coded) representation of the video received at the input 2102 may be used by the component 2108 for generating pixel values or displayable video that is sent to a display interface 2110. The process of generating user-viewable video from the bitstream representation is sometimes called video decompression. Furthermore, while certain video processing operations are referred to as "coding" operations or tools, it will be appreciated that the coding tools or operations are used at an encoder and corresponding decoding tools or operations that reverse the results of the coding will be performed by a decoder.

Examples of a peripheral bus interface or a display interface may include universal serial bus (USB) or high definition multimedia interface (HDMI) or Displayport, and so on. Examples of storage interfaces include serial advanced technology attachment (SATA), peripheral component interconnect (PCI), integrated drive electronics (IDE) interface, and the like. The techniques described in the present document may be embodied in various electronic devices such as mobile phones, laptops, smartphones or other devices that are capable of performing digital data processing and/or video display.

Some embodiments of the disclosed technology include making a decision or determination to enable a video processing tool or mode. In an example, when the video processing tool or mode is enabled, the encoder will use or implement the tool or mode in the processing of a block of video, but may not necessarily modify the resulting bitstream based on the usage of the tool or mode. That is, a conversion from the block of video to the bitstream representation of the video will use the video processing tool or mode when it is enabled based on the decision or determination. In another example, when the video processing tool or mode is enabled, the decoder will process the bitstream with the knowledge that the bitstream has been modified based on the video processing tool or mode. That is, a conversion from the bitstream representation of the video to the block of video will be performed using the video processing tool or mode that was enabled based on the decision or determination.

Some embodiments of the disclosed technology include making a decision or determination to disable a video processing tool or mode. In an example, when the video processing tool or mode is disabled, the encoder will not use the tool or mode in the conversion of the block of video to the bitstream representation of the video. In another example, when the video processing tool or mode is disabled, the decoder will process the bitstream with the knowledge that the bitstream has not been modified using the video processing tool or mode that was disabled based on the decision or determination.

Figure 19:
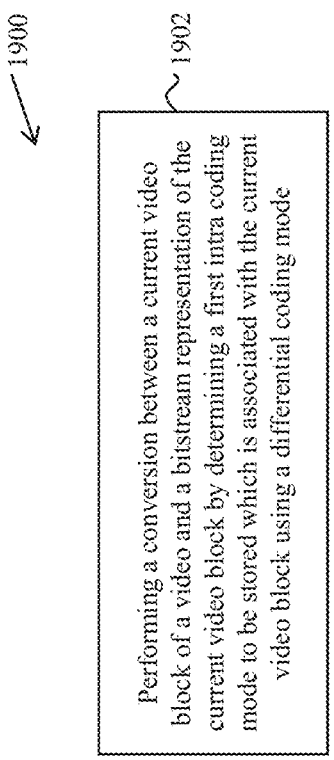
FIGS. 19-20 show flowcharts for example methods of video processing.

FIG. 19 shows a flowchart for an example video processing method 1900. The method 1900 includes performing 1902 a conversion between a current video block of a video and a bitstream representation of the current video block by determining a first intra coding mode to be stored which is associated with the current video block using a differential coding mode, where the first intra coding mode associated with the current video block is determined according to a second prediction mode used by the differential coding mode, and where, in the differential coding mode, a difference between a quantized residual of an intra prediction of the current video block and a prediction of the quantized residual is represented in the bitstream representation for the current video block using a differential pulse coding modulation (DPCM) representation.

In some embodiments for method 1900, the first intra coding mode is inferred to a vertical intra prediction mode in response to the second prediction mode being a vertical prediction mode. In some embodiments for method 1900, the first intra coding mode is inferred to a horizontal intra prediction mode in response to the second prediction mode being a horizontal prediction mode. In some embodiments for method 1900, the first intra coding mode is inferred to a top-left diagonal intra prediction mode in response to the second prediction mode being a top-left diagonal prediction mode. In some embodiments for method 1900, the first intra coding mode is inferred to be same as the second prediction mode.

In some embodiments for method 1900, the second prediction mode is inferred to be same as the first intra coding mode. In some embodiments for method 1900, the first intra coding mode is inferred based on a mode in a most probable modes (MPM) list. In some embodiments for method 1900, the first intra coding mode is a pre-defined intra prediction mode. In some embodiments for method 1900, the pre-defined intra prediction mode includes a Planar mode. In some embodiments for method 1900, the pre-defined intra prediction mode includes a DC mode. In some embodiments for method 1900, the pre-defined intra prediction mode includes a vertical mode. In some embodiments for method 1900, the pre-defined intra prediction mode includes a horizontal mode. In some embodiments for method 1900, additional video blocks of the video are coded with the first intra coding mode, and wherein the current video block precedes in time the additional video blocks. In some embodiments for method 1900, a most probable modes (MPM) list is constructed for the additional video blocks using the first intra coding mode.

Figure 20:
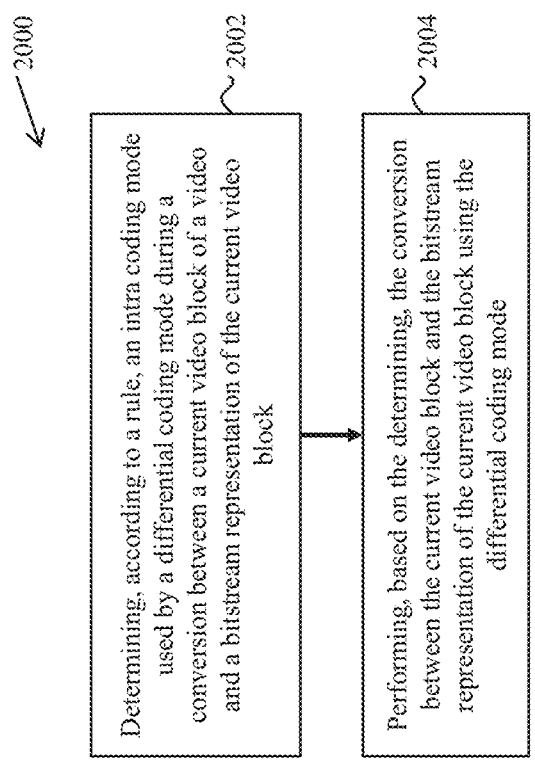

FIG. 20 shows a flowchart for an example video processing method 2000. The method 2000 includes determining 2002, according to a rule, an intra coding mode used by a differential coding mode during a conversion between a current video block of a video and a bitstream representation of the current video block. Operation 2004 includes performing, based on the determining, the conversion between the current video block and the bitstream representation of the current video block using the differential coding mode, where, in the differential coding mode, a difference between a quantized residual of an intra prediction of the current video block and a prediction of the quantized residual is represented in the bitstream representation for the current video block using a differential pulse coding modulation (DPCM) representation, and where the prediction of the quantized residual is performed according to the intra coding mode.

In some embodiments for method 2000, the rule specifies that the intra coding mode is determined based on a color component associated with the current video block. In some embodiments for method 2000, the rule specifies that the intra coding mode is determined based on a message signaled in: a sequence parameter set (SPS), a video parameter set (VPS), a picture parameter set (PPS), a picture header, a slice header, a tile group header, a largest coding unit (LCU) row, or a group of LCUs. In some embodiments for method 2000, the rule specifies that the intra coding mode is determined based on a flag that indicates a direction in which the intra coding mode is performed in the differential coding mode. In some embodiments for method 2000, the rule specifies that the intra coding mode is determined based on a flag that indicates a direction of the prediction of the quantized residual. In some embodiments for method 2000, the rule specifies that the intra coding mode is determined based on a block dimension of either the current video block or a neighboring video block of the current video block.

In some embodiments for method 2000, the rule specifies that the intra coding mode is determined based on a shape of either the current video block or a neighboring video block of the current video block. In some embodiments for method 2000, the rule specifies that the intra coding mode is determined based on most probable modes (MPM) of the current video block or of a neighboring video block of the current video block. In some embodiments for method 2000, the rule specifies that the intra coding mode is determined based on an inter prediction mode or an intra prediction mode of a neighboring video block of the current video block. In some embodiments for method 2000, the rule specifies that the intra coding mode is determined based on motion vectors of a neighboring video block of the current video block. In some embodiments for method 2000, the rule specifies that the intra coding mode is determined based on an indication of whether a neighboring video block of the current video block is coded using the differential coding mode.

In some embodiments for method 2000, the rule specifies that the intra coding mode is determined based on a value of a quantization parameter of the current video block or of a neighboring video block of the current video block. In some embodiments for method 2000, the rule specifies that the intra coding mode is determined based on a color format used for coding the current video block. In some embodiments for method 2000, the rule specifies that the intra coding mode is determined based on whether a separate or a dual coding tree structure is used for coding the current video block. In some embodiments for method 2000, the rule specifies that the intra coding mode is determined based on a transform type applied to the current video block. In some embodiments for method 2000, the rule specifies that the intra coding mode is determined based on a slice or a tile group type or a picture type associated with the current video block.

The following listing of examples is a description of additional embodiments.

1. A method of video processing, comprising: performing a conversion between a current video block and a bitstream representation of the current video block using a differential coding mode and selectively using an intra prediction mode based on a coexistence rule; wherein the intra prediction mode is used for generating predictions for samples of the current video block; and wherein, the differential coding mode is used to represent a quantized residual block from the predictions of the pixels, using a differential pulse coding modulation representation.
2. The method of example 1, wherein the intra prediction mode is a matrix based intra prediction mode (MIP), and wherein the coexistence rule restricts the MIP to a partial of allowed modes of the MIP.
3. The method of example 2, wherein the partial of allowed modes include horizontal or vertical normal intra modes.

Further embodiments of examples 1-3 are described in item 1, section 4. For example, the differential coding mode may represent the current version of the QR-BDPCM coding mode.

4. The method of example 1, wherein the intra prediction mode includes a prediction along a non-horizontal or a non-vertical direction.
5. The method of example 1 or 4, wherein the intra prediction mode is a planar or a DC prediction mode.
6. The method of example 1 or 4, wherein the intra prediction modes is a vertical or a horizontal prediction mode.
7. The method of example 1 or 4, wherein the intra prediction mode is identified by a field in the bitstream representation.
8. The method of example 1 or 4, wherein the intra prediction mode is dependent on a block dimension of the current video block or a neighboring block.
9. The method of example 1 or 4, wherein the intra prediction mode is dependent on a shape of the current block or a neighboring block.
10. The method of example 1 or 4, wherein the intra prediction mode is dependent on whether the current video block or the neighboring video block is coded using inter prediction or intra prediction.
11. The method of example 1 or 4, wherein the intra prediction mode is dependent on whether the neighboring video block is coded using the differential coding mode.
12. The method of example 1 or 4, wherein the intra prediction mode is dependent on value of a quantization parameter used for the current video block or the neighboring video block.
13. The method of example 1 or 4, wherein the intra prediction mode is dependent on a color format used for coding the current video block.
14. The method of example 1 or 4, wherein the intra prediction mode is dependent on whether a separate or a dual coding tree structure is used for coding the current video block.

Further embodiments of examples 4 to 14 are provided in item 2 of section 4.

15. The method of example 1, wherein the generating predictions for samples of the current video block is performed from non-adjacent samples in a neighboring video region.
16. The method of example 1, wherein the intra prediction mode comprises an intra block copy merge mode.
17. The method of example 1, wherein the intra prediction mode comprises an intra block copy advanced motion vector prediction mode.
18. The method of any of examples 15 to 17, wherein the intra prediction mode is indicated by a block vector or a merge index.

Further embodiments of examples 15 to 18 are provided in item 3 of section 4.

19. The method of example 1, wherein the coexistence rule specifies a mapping from a signaled index in the differential coding mode to the intra prediction mode based on a field in the bitstream representation.
20. The method of example 1, wherein the coexistence rule specifies a mapping from a signaled index in the differential coding mode to the intra prediction mode based on a dimension of the current video block or a neighboring block.
21. The method of example 1, wherein the coexistence rule specifies a mapping from a signaled index in the differential coding mode to the intra prediction mode based on a shape of the current video block or a neighboring block.
22. The method of example 1, wherein the coexistence rule specifies a mapping from a signaled index in the differential coding mode to the intra prediction mode based on a prediction mode of the current video block or a neighboring block.
23. The method of example 1, wherein the coexistence rule specifies a mapping from a signaled index in the differential coding mode to the intra prediction mode based on most probable modes of the current video block or a neighboring block.
24. The method of example 1, wherein the coexistence rule specifies a mapping from a signaled index in the differential coding mode to the intra prediction mode based on motion vectors of the current video block or a neighboring block.
25. The method of example 1, wherein the coexistence rule specifies a mapping from a signaled index in the differential coding mode to the intra prediction mode based on whether or not a neighboring block is coded using the differential coding mode.
26. The method of example 1, wherein the coexistence rule specifies a mapping from a signaled index in the differential coding mode to the intra prediction mode based on a quantization parameter used by the current video block or a neighboring block.
27. The method of example 1, wherein the coexistence rule specifies a mapping from a signaled index in the differential coding mode to the intra prediction mode based on a color format of the current video block.
28. The method of example 1, wherein the coexistence rule specifies a mapping from a signaled index in the differential coding mode to the intra prediction mode based on whether a separate or a dual coding tree is used by the current video block.
29. The method of example 1, wherein the coexistence rule specifies a mapping from a signaled index in the differential coding mode to the intra prediction mode based on a transform applied to the current video block.

30. The method of example 1, wherein the coexistence rule specifies a mapping from a signaled index in the differential coding mode to the intra prediction mode based on a slice type or a tile group type or a picture type of the current video block.

Further embodiments of examples 19 to 30 are provided in item 2 of section 4.

31. A method of video processing, comprising: performing a conversion between a current video block and a bitstream representation of the current video block using a differential coding mode in which a quantized residual block from a predictions of pixels of the current video block is represented using a differential pulse coding modulation representation; wherein a first direction of the prediction or a second direction of the differential coding mode is inferable from the bitstream representation.

32. The method of example 31, wherein the first direction of the prediction of pixels is implicitly inferable from an intra prediction mode used for the predicting.

33. The method of example 32, wherein the second direction of the differential coding mode is inferable to be a same direction as the first direction of the prediction.

34. The method of example 31, wherein the second direction is inferable from an intra prediction mode used for the predicting.

35. The method of example 31, wherein the second direction is inferable from a dimension of the current video block or a neighboring block or a shape of the current video block or a neighboring block.

36. The method of example 31, wherein the second direction is inferable from motion vectors of a neighboring block.

37. The method of example 31, wherein the second direction is inferable from most probable modes of the current video block or a neighboring block.

38. The method of example 31, wherein the second direction is inferable from a prediction mode of a neighboring block.

39. The method of example 31, wherein the second direction is inferable from an intra prediction mode of a neighboring block.

40. The method of example 31, wherein the second direction is inferable from whether or not a neighboring block uses the differential coding mode.

Further embodiments of examples 31-40 are provided in item 4 of section 4.

41. A method of video processing, comprising: determining, based on an applicability rule, that a differential coding mode is applicable to a conversion between a current video block and a bitstream representation of the current video block; and performing the conversion between a current video block and a bitstream representation using the differential coding mode; wherein, in the differential coding mode, a quantized residual block from intra prediction of pixels of the current video block is represented using a differential pulse coding modulation representation performed in a residual prediction direction that is different from a horizontal or a vertical direction.

42. The method of example 41, wherein the residual prediction direction is a 45-degree direction.

43. The method of example 41, wherein the residual prediction direction is a 135-degree direction.

44. The method of example 41, wherein the residual prediction direction is related to a field in the bitstream representation or a dimension of the current video block or a neighboring block or a shape of the current video block or the neighboring block.

Further embodiments of examples 41 to 44 are provided in item 7 of section 4.

45. The method of example 41, wherein the applicability rule specifies to use the differential coding mode due to the current video block being a chroma block.

46. The method of example 45, wherein the applicability rule further specifies to that the residual prediction direction for the current video block is a same direction as that for a luma block corresponding to the current video block.

47. The method of example 41, wherein the applicability rule specifies to use the differential coding due to the current video block not using a cross-component linear model (CCLM) coding mode.

Further embodiments of examples 45 to 47 are provided in item 8 of section 4.

48. The method of example 41, wherein the applicability rule specifies to derive applicability of the differential coding mode for one color component from applicability of the differential coding mode for another color component.

Further embodiments of example 48 are provided in item 12 of section 4.

49. A method of video processing, comprising: determining that a differential coding mode is applicable to a conversion between a current video block and a bitstream representation of the current video block; and performing the conversion between a current video block and a bitstream representation using an implementation rule of the differential coding mode; wherein, in the differential coding mode, a quantized residual block from intra prediction of pixels of the current video block is represented using a differential pulse coding modulation representation performed in a residual prediction direction that is different from a horizontal or a vertical direction.

50. The method of example 49, wherein the implementation rule specifies to restrict values of the quantized residual block within a range.

51. The method of example 49, wherein the implementation rule specifies using clipping to obtain the quantized residual block.

Further embodiments of examples 49-51 are provided in item 9 of section 4.

52. The method of example 49, wherein the implementation rule specifies to perform prediction from a last row of the current video block to a first row of the current video block.

53. The method of example 49, wherein the implementation rule specifies to perform prediction from a last column of the current video block to a first column of the current video block.

Further embodiments of examples 52 to 53 are provided in item 10 of section 4.

54. The method of example 49, wherein the implementation rule specifies to apply the differential coding mode to only a subset of the current video block.

55. The method of example 54, wherein the subset excludes k left columns of residues, where k is an integer smaller than a pixel width of the block.

56. The method of example 54, wherein the subset excludes k top rows of residues, where k is an integer smaller than a pixel height of the block.

Further embodiments of examples 54 to 56 are provided in item 10 of section 4.
  57. The method of example 49, wherein the implementation rule specifies to apply the differential coding mode on a segment by segment basis to the conversion.

Further embodiments of example 57 are provided in item 12 of section 4.
  58. A method of video processing, comprising: determining that a differential coding mode used during a conversion between a current video block and a bitstream representation of the current video block is same as an intra coding mode associated with the current video block; and performing the conversion between a current video block and a bitstream representation using an implementation rule of the differential coding mode; wherein, in the differential coding mode, a quantized residual block from intra prediction of pixels of the current video block is represented using a differential pulse coding modulation representation performed in a residual prediction direction that is different from a horizontal or a vertical direction.
  59. The method of example 58, wherein the differential coding mode is a vertical intra prediction mode.
  60. The method of example 58, wherein the differential coding mode is a horizontal intra prediction mode.
  61. The method of example 58, wherein the differential coding mode is a predefined intra prediction mode.

Further embodiments for examples 58-61 are described in item 5 of section 4.
  62. A video processing apparatus comprising a processor configured to implement one or more of examples 1 to 61.
  63. A computer-readable medium having code stored thereon, the code, when executed by a processor, causing the processor to implement a method recited in any one or more of examples 1 to 61.

In the listing of examples in this present document, the term conversion may refer to the generation of the bitstream representation for the current video block or generating the current video block from the bitstream representation. The bitstream representation need not represent a contiguous group of bits and may be divided into bits that are included in header fields or in codewords representing coded pixel value information.

In the examples above, the applicability rule may be pre-defined and known to encoders and decoders.

It will be appreciated that the disclosed techniques may be embodied in video encoders or decoders to improve compression efficiency using techniques that include the use of various implementation rules of considerations regarding the use of a differential coding mode in intra coding, as described in the present document.

The disclosed and other solutions, examples, embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., a field programmable gate array (FPGA) or an application specific integrated circuit (ASIC).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., erasable programmable read-only memory (EPROM), electrically erasable programmable read-only memory (EEPROM), and flash memory devices; magnetic disks, e.g., internal hard disks or removable disks; magneto optical disks; and compact disc, read-only memory (CD ROM) and digital versatile disc read-only memory (CD-ROM) disks. The processor and the memory can be supplemented by, or incorporated in, special purpose logic circuitry.

While this patent document contains many specifics, these should not be construed as limitations on the scope of any subject matter or of what may be claimed, but rather as descriptions of features that may be specific to particular embodiments of particular techniques. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claims is:

1. A method of processing video data, comprising:
   determining that a differential coding mode is applied to a first video block of a video, and in the differential coding mode, a difference between a quantized residual derived with a first intra prediction mode of the first video block and a prediction of the quantized residual is included in a bitstream of the video;
   storing, aligned with a prediction direction used in the differential coding mode for the first video block, the first intra prediction mode of the first video block;
   constructing, based on the stored first intra prediction mode of the first video block, a mode candidate list for a second video block of the video, wherein the first video block is a spatial neighboring block of the second video block and the second video block is an intra block;
   determining, based on the mode candidate list, a second intra prediction mode for the second video block; and
   performing, based on the second intra prediction mode, a conversion between the second video block and the bitstream of the video,
   wherein the first intra prediction mode is inferred to a vertical intra prediction mode in response to the prediction direction used in the differential coding mode for the first video block being vertical direction,
   wherein the first intra prediction mode is inferred to a horizontal intra prediction mode in response to the prediction direction used in the differential coding mode for the first video block being horizontal direction, and
   wherein a cross-component linear model coding mode is not applied to the first video block in response to the differential coding mode being applied to the first video block.

2. The method of claim 1, wherein the prediction direction of the differential coding mode for the first video block is determined based on a first syntax element included in the bitstream indicating whether the prediction direction is horizontal or vertical direction.

3. The method of claim 1, wherein the first video block is a left or above neighboring block of the second video block.

4. The method of claim 1, wherein when the first video block is not available, a candidate in the mode candidate list corresponding to the first video block is set to a planar intra prediction mode.

5. The method of claim 1, wherein the second intra prediction mode is determined based on a second syntax element in the bitstream, wherein the second syntax element indicates an index of a candidate in the mode candidate list which is used for an intra prediction of the second video block.

6. The method of claim 1, wherein the first video block is a luma block, and a third syntax element is further used to indicate whether the differential coding mode is applied to a chroma components or not.

7. The method of claim 1, wherein the difference is represented using a differential pulse coding modulation representation.

8. The method of claim 1, wherein the conversion includes encoding the second video block into the bitstream.

9. The method of claim 1, wherein the conversion includes decoding the second video block from the bitstream.

10. An apparatus for processing video data comprising a processor and a non-transitory memory with instructions thereon, wherein the instructions upon execution by the processor, cause the processor to:
    determine that a differential coding mode is applied to a first video block of a video, and in the differential coding mode, a difference between a quantized residual derived with a first intra prediction mode of the first video block and a prediction of the quantized residual is included in a bitstream of the video;
    store, aligned with a prediction direction used in the differential coding mode for the first video block, the first intra prediction mode of the first video block;
    construct, based on the stored first intra prediction mode of the first video block, a mode candidate list for a second video block of the video, wherein the first video block is a spatial neighboring block of the second video block and the second video block is an intra block;
    determine, based on the mode candidate list, a second intra prediction mode for the second video block; and
    perform, based on the second intra prediction mode, a conversion between the second video block and the bitstream of the video,
    wherein the first intra prediction mode is inferred to a vertical intra prediction mode in response to the prediction direction used in the differential coding mode for the first video block being vertical direction,
    wherein the first intra prediction mode is inferred to a horizontal intra prediction mode in response to the prediction direction used in the differential coding mode for the first video block being horizontal direction, and
    wherein a cross-component linear model coding mode is not applied to the first video block in response to the differential coding mode being applied to the first video block.

11. The apparatus of claim 10, wherein the prediction direction of the differential coding mode for the first video block is determined based on a first syntax element included in the bitstream indicating whether the prediction direction is horizontal or vertical direction.

12. The apparatus of claim 10, wherein the first video block is a left or above neighboring block of the second video block, and when the first video block is not available, a candidate in the mode candidate list corresponding to the first video block is set to a planar intra prediction mode.

13. The apparatus of claim 10, wherein the second intra prediction mode is determined based on a second syntax element in the bitstream, wherein the second syntax element indicates an index of a candidate in the mode candidate list which is used for an intra prediction of the second video block.

14. A non-transitory computer-readable storage medium storing instructions that cause a processor to:
  determine that a differential coding mode is applied to a first video block of a video, and in the differential coding mode, a difference between a quantized residual derived with a first intra prediction mode of the first video block and a prediction of the quantized residual is included in a bitstream of the video;
  store, aligned with a prediction direction used in the differential coding mode for the first video block, the first intra prediction mode of the first video block;
  construct, based on the stored first intra prediction mode of the first video block, a mode candidate list for a second video block of the video, wherein the first video block is a spatial neighboring block of the second video block and the second video block is an intra block;
  determine, based on the mode candidate list, a second intra prediction mode for the second video block; and
  perform, based on the second intra prediction mode, a conversion between the second video block and the bitstream of the video,
  wherein the first intra prediction mode is inferred to a vertical intra prediction mode in response to the prediction direction used in the differential coding mode for the first video block being vertical direction,
  wherein the first intra prediction mode is inferred to a horizontal intra prediction mode in response to the prediction direction used in the differential coding mode for the first video block being horizontal direction, and
  wherein a cross-component linear model coding mode is not applied to the first video block in response to the differential coding mode being applied to the first video block.

15. The non-transitory computer-readable storage medium of claim 14,
  wherein the prediction direction of the differential coding mode for the first video block is determined based on a first syntax element included in the bitstream indicating whether the prediction direction is horizontal or vertical direction.

16. A non-transitory computer-readable recording medium storing a bitstream of a video which is generated by a method performed by a video processing apparatus, wherein the method comprises:
  determining that a differential coding mode is applied to a first video block of the video, and in the differential coding mode, a difference between a quantized residual derived with a first intra prediction mode of the first video block and a prediction of the quantized residual is included in the bitstream of the video;
  storing, aligned with a prediction direction used in the differential coding mode for the first video block, the first intra prediction mode of the first video block;
  constructing, based on the stored first intra prediction mode of the first video block, a mode candidate list for a second video block of the video, wherein the first video block is a spatial neighboring block of the second video block and the second video block is an intra block;
  determining, based on the mode candidate list, a second intra prediction mode for the second video block; and
  generating the bitstream based on the second intra prediction mode,
  wherein the first intra prediction mode is inferred to a vertical intra prediction mode in response to the prediction direction used in the differential coding mode for the first video block being vertical direction,
  wherein the first intra prediction mode is inferred to a horizontal intra prediction mode in response to the prediction direction used in the differential coding mode for the first video block being horizontal direction, and
  wherein a cross-component linear model coding mode is not applied to the first video block in response to the differential coding mode being applied to the first video block.

17. The non-transitory computer-readable recording medium of claim 16,
  wherein the prediction direction of the differential coding mode for the first video block is determined based on a first syntax element included in the bitstream indicating whether the prediction direction is horizontal or vertical direction.

* * * * *